US009064356B2

(12) United States Patent
Salmon et al.

(10) Patent No.: US 9,064,356 B2
(45) Date of Patent: Jun. 23, 2015

(54) SYSTEM OF STACKED DEVICES

(71) Applicant: iBlaidZ, Inc., Mountain View, CA (US)

(72) Inventors: Peter C. Salmon, Mountain View, CA (US); Jorge Fernandes, Danville, CA (US); Paul Meissner, San Jose, CA (US); Jerry Panagrossi, San Carlos, CA (US)

(73) Assignee: IBLAIDZ, INC., Mountain View, CA (US)

( * ) Notice: Subject to any disclaimer, the term of this patent is extended or adjusted under 35 U.S.C. 154(b) by 0 days.

(21) Appl. No.: 14/271,376

(22) Filed: May 6, 2014

(65) Prior Publication Data

US 2014/0240085 A1 Aug. 28, 2014

Related U.S. Application Data

(62) Division of application No. 14/017,040, filed on Sep. 3, 2013, now Pat. No. 8,798,675.

(60) Provisional application No. 61/696,245, filed on Sep. 3, 2012, provisional application No. 61/708,730, filed (Continued)

(51) Int. Cl.
*H04M 3/00* (2006.01)
*G07C 9/00* (2006.01)
(Continued)

(52) U.S. Cl.
CPC ........ *G07C 9/00182* (2013.01); *H01R 13/6205* (2013.01); *H05K 13/00* (2013.01);
(Continued)

(58) Field of Classification Search
USPC ........... 455/41.1, 41.2, 90.3, 418–420, 550.1, 455/552.1, 556.1, 556.2, 557, 558
See application file for complete search history.

(56) References Cited

U.S. PATENT DOCUMENTS 3,786,391 A 1/1974 Mathauser
3,810,258 A 5/1974 Mathauser
(Continued)

FOREIGN PATENT DOCUMENTS

CN 202888505 U 4/2013
WO WO 03/090321 A1 10/2003
(Continued)

OTHER PUBLICATIONS

International Search Report and Written Opinion, PCT International Patent Application No. PCT/US2013/057846, mailed Feb. 6, 2014.
(Continued)

*Primary Examiner* — Nhan Le
(74) *Attorney, Agent, or Firm* — Kilpatrick Townsend & Stockton LLP

(57) ABSTRACT

A method of implementing use cases includes associating a use case with each of a plurality of devices capable of being used or accessed by a user. The method also includes providing a plurality of stackable blades, each providing a standard physical interface and being configured to implement a solution to the use case associated with each of the plurality of devices. The method further includes stacking the plurality of stackable blades to form an interconnected stack. Each of the plurality of stackable blades are coupled using the standard physical interface. The method also includes executing a first purpose corresponding to a first use case and executing a second purpose corresponding to a second use case. Embodiments provide an electronic ecosystem featuring ubiquitous connectivity in which a standard contact array in each component of the ecosystem assures interoperability between heterogeneous devices.

4 Claims, 27 Drawing Sheets

Related U.S. Application Data on Oct. 2, 2012, provisional application No. 61/751,936, filed on Jan. 13, 2013, provisional application No. 61/803,494, filed on Mar. 20, 2013, provisional application No. 61/807,609, filed on Apr. 2, 2013, provisional application No. 61/823,071, filed on May 14, 2013, provisional application No. 61/840,529, filed on Jun. 28, 2013, provisional application No. 61/844,006, filed on Jul. 9, 2013.

(51) Int. Cl.
| | | |
|---|---|---|
| *H01R 13/62* | (2006.01) | |
| *H05K 13/00* | (2006.01) | |
| *H04M 1/725* | (2006.01) | |
| *H04M 1/02* | (2006.01) | |

(52) U.S. Cl.
CPC ........ *H04M1/72519* (2013.01); *H04M 1/0256* (2013.01); *H04M 1/7253* (2013.01); *G07C 2009/00206* (2013.01); *H05K 13/0023* (2013.01)

(56) References Cited

U.S. PATENT DOCUMENTS

| | | | |
|---|---|---|---|
| 4,390,232 | A | 6/1983 | Jamgotchian |
| 4,479,685 | A | 10/1984 | Kirby |
| 4,966,556 | A | 10/1990 | Reymond et al. |
| 5,347,428 | A | 9/1994 | Carson |
| 5,642,265 | A | 6/1997 | Bond |
| 5,917,709 | A | 6/1999 | Johnson et al. |
| 5,921,783 | A | 7/1999 | Fritsch et al. |
| 5,923,526 | A | 7/1999 | Kangas |
| 5,986,887 | A | 11/1999 | Smith et al. |
| 6,137,164 | A | 10/2000 | Yew et al. |
| 6,144,888 | A | 11/2000 | Lucas et al. |
| 6,420,953 | B1 | 7/2002 | Dadafshar |
| 6,628,531 | B2 | 9/2003 | Dadafshar |
| 6,871,047 | B2 | 3/2005 | Iwata |
| 6,958,531 | B2 | 10/2005 | Ucok et al. |
| 7,145,179 | B2 | 12/2006 | Petroski |
| 7,252,512 | B2 | 8/2007 | Tai et al. |
| 7,311,526 | B2 | 12/2007 | Rohrbach et al. |
| 7,329,128 | B1 | 2/2008 | Awad |
| 7,331,793 | B2 | 2/2008 | Hernandez et al. |
| 7,341,458 | B1 | 3/2008 | Koh |
| 7,344,379 | B2 | 3/2008 | Marmaropoulos et al. |
| 7,348,785 | B2 | 3/2008 | Maxwell |
| 7,467,948 | B2 | 12/2008 | Lindberg et al. |
| 7,579,683 | B1 * | 8/2009 | Falik et al. ............ 257/690 |
| 7,641,476 | B2 | 1/2010 | Didur et al. |
| 7,658,613 | B1 | 2/2010 | Griffin et al. |
| 7,719,098 | B2 | 5/2010 | Wehrly |
| 7,758,349 | B2 | 7/2010 | Han et al. |
| 7,885,685 | B2 | 2/2011 | Himmelstein |
| 7,942,678 | B2 | 5/2011 | Sanford et al. |
| 8,094,458 | B2 | 1/2012 | Furnival |
| 8,138,869 | B1 | 3/2012 | Lauder et al. |
| 8,185,155 | B2 | 5/2012 | Chang et al. |
| 8,242,868 | B2 | 8/2012 | Lauder et al. |
| 8,266,793 | B2 | 9/2012 | Lotfi et al. |
| 8,348,678 | B2 | 1/2013 | Hardisty et al. |
| 8,390,412 | B2 | 3/2013 | Lauder et al. |
| 8,395,901 | B2 | 3/2013 | Tour et al. |
| 8,435,042 | B2 | 5/2013 | Rohrbach et al. |
| 8,442,581 | B2 | 5/2013 | Chung et al. |
| 8,454,372 | B2 | 6/2013 | Lee et al. |
| 8,498,124 | B1 | 7/2013 | Folker et al. |
| 8,529,247 | B2 | 9/2013 | Poe et al. |
| 8,690,582 | B2 | 4/2014 | Rohrbach et al. |
| 2004/0022026 | A1 | 2/2004 | Belady et al. |
| 2007/0099603 | A1 | 5/2007 | Castres et al. |
| 2008/0029147 | A1 | 2/2008 | Yang et al. |
| 2008/0150132 | A1 | 6/2008 | Hu et al. |
| 2009/0150547 | A1 * | 6/2009 | Tripathi ............ 709/226 |
| 2009/0212637 | A1 | 8/2009 | Baarman et al. |
| 2009/0214051 | A1 | 8/2009 | Lockett et al. |
| 2010/0164671 | A1 | 7/2010 | Pagani |
| 2011/0092081 | A1 | 4/2011 | Gao et al. |
| 2011/0114377 | A1 | 5/2011 | Brun |
| 2011/0192857 | A1 | 8/2011 | Rothbaum |
| 2012/0201068 | A1 | 8/2012 | Ware |
| 2012/0218211 | A1 | 8/2012 | McRae et al. |
| 2012/0301730 | A1 | 11/2012 | Yagi et al. |
| 2013/0050958 | A1 | 2/2013 | Bdeir |
| 2014/0065847 | A1 | 3/2014 | Salmon et al. |
| 2014/0066128 | A1 | 3/2014 | Salmon et al. |

FOREIGN PATENT DOCUMENTS

| | | |
|---|---|---|
| WO | WO 2012/030228 A1 | 3/2012 |
| WO | WO 2013/106284 A2 | 7/2013 |

OTHER PUBLICATIONS

Restriction Requirement, U.S. Appl. No. 14/017,000, mailed Feb. 14, 2014.

Response to Restriction Requirement, U.S. Appl. No. 14/017,000, filed May 6, 2014.

Non-Final Office Action, U.S. Appl. No. 14/017,000, mailed May 23, 2014.

Restriction Requirement, U.S. Appl. No. 14/017,040, mailed Dec. 3, 2013.

Response to Restriction Requirement, U.S. Appl. No. 14/017,040, filed Dec. 10, 2013.

Notice of Allowance, U.S. Appl. No. 14/017,040, mailed Feb. 6, 2014.

Non-Final Office Action, U.S. Appl. No. 14/017,000, mailed Jan. 29, 2015.

* cited by examiner

SYSTEM OF STACKED DEVICES

CROSS-REFERENCES TO RELATED APPLICATIONS

This application claims priority to U.S. patent application Ser. No. 14/017,040, filed Sep. 3, 2013, entitled "System of Stacked Devices", which claims the benefit of U.S. Provisional Patent Application Nos. 61/696,245, filed on Sep. 3, 2012, entitled "Magnetically and Electrically Coupled Devices, 61/708,730, filed on Oct. 2, 2012, entitled "Magnetically and Electrically Coupled Devices,", 61/751,936, filed on Jan. 13, 2013, entitled "Magnetically and Electrically Coupled Devices, 61/803,494, filed on Mar. 20, 2013, entitled, "Method and Apparatus for Trusted Pairs and Private Networks, 61/807,609, filed on Apr. 2, 2013, entitled "Protocol Converter Module, 61/823,071, filed on May 14, 2013, entitled "Snap On Module Interface, 61/840,529, filed on Jun. 28, 2013, entitled "Magnetically Attached Chip Package, and 61/844,006, filed on Jul. 9, 2013, entitled "Snap On Wearable Module, the disclosures of which are hereby incorporated by reference in their entirety for all purposes.

The following regular U.S. patent applications (including this one) are being filed concurrently, and the entire disclosure of the other application is incorporated by reference into this application for all purposes:

application Ser. No. 14/017,000, filed Sep. 3, 2013, entitled "METHOD AND SYSTEM FOR SMART CONTACT ARRAYS"; and application Ser. No. 14/017,040, filed Sep. 3, 2013, entitled "SYSTEM OF STACKED DEVICES"

BACKGROUND OF THE INVENTION

Electronic devices may be connected using cables and connectors. An example of a popular serial data interface is THUNDERBOLT, capable of a transfer speed of 10 Gbit/second and available using a copper cable and a MINI DISPLAYPORT connector.

Cables and connectors each have a significant manufacturing cost. They also require a user to carry them with their electronic equipment, to plug them in for use and to unplug them after use. In certain applications, particularly involving mobile devices, users may prefer a connection scheme that does not require cables and requirements for plugging and unplugging. Thus, despite the progress made in electronic devices, there is a need in the art for improved methods and systems for physically interconnecting electronic modules and devices.

SUMMARY OF THE INVENTION

Embodiments of the present invention relate to a device incorporating a contact array and to an interface comprising a smart interface element. In some embodiments, stacked systems including contact arrays are provided. Moreover, methods pertaining thereto are also provided in some embodiments.

According to an embodiment of the present invention, a device is provided. The device includes a device body having an attachment face defined by an attachment area and a contact array disposed in the device body and exposed at a coupling face. The contact array comprises one or more magnets disposed on the coupling face and a plurality of terminals disposed on the coupling face. A periphery of the one or more magnets and the plurality of terminals defines a coupling area. The attachment area is greater than and independent of the coupling area.

According to another embodiment of the present invention, a system of coupled devices is provided. The system includes a first device comprising a first microcontroller and a first interface element disposed in a first coupling face having a first attachment area and a second device comprising a second microcontroller and a second interface element disposed in a second coupling face having a second attachment area. Each of the first interface element and the second interface element comprise one or more magnets disposed on the respective coupling face and a plurality of terminals disposed on the respective coupling face. A periphery of the one or more magnets and the plurality of terminals of each device defines a coupling area, which may also be referred to as a contact area. The first attachment area and the second attachment area are greater than and independent of the coupling area.

According to yet another embodiment of the present invention, a method for connecting electronic devices is provided. The method includes providing a first device having a first contact array comprising a coupling force element and a plurality of terminals. The first device has a geometry independent of the first contact array. The method also includes providing a second device having a second contact array comprising a second coupling force element and a second plurality of terminals. The second contact array is matched to the first contact array. The method further includes positioning the first and second devices with the first and second contact arrays in proximate alignment, coupling the first and second devices together for operational use as a combined system, and uncoupling the first and second devices when the operations of the combined system have been completed.

According to an embodiment of the present invention, a contact array is provided. The contact array includes a coupling force element and a plurality of terminals. It may be embedded in any coupling surface of any device; the device may range from a smart watch, to a smart phone, to a tablet, to a desktop computer, and to a large system having a docking element. The coupling force element may comprise one or more magnets, embedded electrical charges, or mechanically interlocking features. Terminals of the contact array on at least one side of a mated pair are preferably mechanically compliant. When opposing contact arrays are coupled together, the terminals preferably conform to the available space between them. Contact arrays may be coupled and uncoupled in a hot-swappable manner by manipulating the host devices in a user's fingers, and a snap-on snap-off method is provided for coupling and uncoupling respectively. A smart interface element comprises a microcontroller and a contact array in a unified interface assembly.

An embodiment of the present invention comprises a device having a substrate positioned at a first coupling face, and a second coupling face opposite the first coupling face. The device further comprises one or more contact arrays disposed in one or more coupling faces. Each contact array comprises one or more pairs of magnets and a plurality of terminals mounted in the substrate. Also, a microcontroller chip is mounted on the substrate. With respect to a bisector of each contact array, the magnets are preferably configured with complementary magnetic symmetry, to be further described, and the terminals are preferably configured with reflective symmetry. So as not to interfere with sensitive magnetic sensors or electronic circuits within the device, each pair of magnets may be further configured with a magnetic field containment device comprising a material of high magnetic permeability. Each terminal may be mechanically compliant and electrically conductive. Each magnet or commoned pair of magnets may be used as an electrical terminal capable of high current. The magnets and the terminals may extend through the device and be operable at both the first and second coupling faces. Alternatively, a separate set of magnets and terminals may be provided in each of the first and second coupling faces. A touch/display screen may be mounted at either coupling face. The substrate may comprise a lead frame having a die attach region and individual leads; the microcontroller chip may be attached to the die attach region, each terminal may be attached to a corresponding lead, and a bond wire or interconnection element may connect from each lead to a selected input/output pad of the microcontroller. The substrate may also comprise a tape substrate and the tape substrate may comprise a polyimide material. A metal foil or a glass sheet may be attached at either or both of the first and second coupling faces, creating a moisture barrier. Openings in the metal foil or glass sheet may be provided as required for contact arrays, or for elements of contact arrays. Mechanical features may protrude from a coupling face of the device, and may comprise a stabilizing element. A contact array may comprise recesses that match corresponding protruding elements in an opposing contact array. The microcontroller may comprise a processor and a memory coupled to the processor, wherein the memory is encoded with instructions that are executable by the processor to manage device-specific operations plus communications with other devices.

An alternative embodiment relates to an interface between a first and a second device. The interface comprises a smart interface element positioned in a coupling face of each of the first and second coupling devices. Each smart interface element comprises a substrate positioned at the coupling face, one or more pairs of magnets mounted in the substrate, a plurality of terminals mounted in the substrate, and a microcontroller mounted on the substrate. With respect to a bisector of each smart interface element, each pair of magnets is preferably configured with complementary magnetic symmetry, to be further described. With respect to the same bisector, the terminals are preferably configured with reflective symmetry. Opposing magnets at the interface may be coupled or uncoupled by applying a user's fingers to the first and second devices and employing a snap-on or a snap-off action respectively. When coupled, the breakaway force between the first and second devices may be in the range of 0.1-4.0 pounds, a force that can be easily managed in a user's fingers. The coupling and uncoupling of the first and second devices are each preferably hot-swappable; the actions may not need to be preceded by a power-down sequence.

According to another embodiment of the present invention, a method for connecting electronic devices is provided. A first device has a first contact array comprising a coupling force element and a plurality of terminals. A second device has a second contact array matched to the first contact array. Matched contact arrays provide corresponding coupling force elements that may achieve alignment and coupling when they oppose one another, and opposing terminals that are configured to make good electrical contact and support high rate data transfers. A serial transfer rate of 50-500 Mbps or more may be supported by the contact arrays for example.

In addition, electrical connection between opposing magnets may support a current of 1-10 amperes for example. The first and second coupling devices are positioned with the first and second contact arrays in proximate alignment, whereupon the first and second devices snap together to couple them for use as a combined system. The first and second devices may be unsnapped to uncouple them. The coupling force element may comprise at least one of: one or more magnets, embedded electrical charges, or mechanically interlocking features. The unsnapping step may further comprise: holding the first device between thumb and fingers of a first hand, gripping the second device between thumb and fingers of a second hand, and manipulating the second device with respect to the first device until the devices are uncoupled. A successful tone sequence may be generated when coupling of the first and second contact arrays has completed successfully, and a second distinctive tone sequence may be generated when the first and second contact arrays have been uncoupled. Each of the coupling and uncoupling events are preferably hot-swappable, wherein coupling and uncoupling may be performed by a user spontaneously, without the need for a user to concern themselves about a power shut down sequence for example.

As described herein, the present invention may enable "ubiquitous connectivity". Ubiquitous connectivity may comprise multiple classes of electronic devices that are configured to conveniently connect and communicate with each another via standardized contact arrays or smart embedded contact modules that are embodied in the devices. The classes of devices so connected may include smart watch devices, smart phone devices, tablet devices, desktop computers, automobile dashboards, television sets, banking terminals, and docking station devices as non-limiting examples.

According to an embodiment of the present invention, an electronic system is provided. The electronic system includes an electronic device operable to provide a first functionality. A periphery of the electronic device defines a device area and the electronic device comprises a processor, one or more coupling force elements disposed on a coupling face of the electronic device, and a plurality of terminals disposed on the coupling face. A periphery of the one or more coupling force elements and the plurality of terminals defines a coupling area. The electronic system also includes one or more blades, at least one of the one or more blades being coupled to the electronic device at a blade device face having a blade area. Each of the one or more blades comprises a microcontroller, one or more blade coupling force elements matched to the one or more coupling force elements of the electronic device, and a plurality of blade terminals matched to the plurality of terminals of the electronic device. A periphery of the one or more blade coupling force elements and the plurality of blade terminals define the coupling area. The device area and the blade area are independent of the coupling area.

According to another embodiment of the present invention, a user companion device is provided. The user companion device includes a base unit comprising a battery and a communications unit. The user companion device also includes a first blade coupled to the base unit and including a mobile payment unit and a second blade coupled to the first blade and including an electronic key unit.

According to yet another embodiment of the present invention, a method of implementing use cases is provided. The method includes associating a use case with each of a plurality of devices capable of being used or accessed by a user and providing a plurality of stackable blades, each of the plurality of stackable blades providing a standard physical interface and being configured to implement a solution to the use case associated with each of the plurality of devices. The method also includes stacking the plurality of stackable blades to form an interconnected stack. Each of the plurality of stackable blades are coupled using the standard physical interface. The method further includes executing a first purpose corresponding to a first use case and executing a second purpose corresponding to a second use case.

A further embodiment of the present invention relates to an electronic system. The electronic system comprises a stack of blades and each blade includes an interface module in a coupling face. The interface module comprises a substrate, a coupling force element, a plurality of terminals, and a micro-controller. The coupling force element may comprise at least one of a magnet, a region of electric charge, or a mechanically inter-lockable feature. One blade may be a top blade and comprise a touch/display screen. One blade may be a bottom blade and comprise an element of a docking station device. A blade may comprise a second coupling face and a second interface module in the second coupling face. The element of a docking station device may be attached to a band that attaches to a user's wrist. The micro-controller comprises a processor and a memory coupled to the processor, wherein the memory is encoded with instructions that are executable by the processor to manage the blade and its relationship to other blades within the stack; this includes communications between blades and between blades and devices external to the stack. Management of a blade may further comprise dynamic re-configurability as a master or a slave within the stack of blades. The micro-controller may perform as a protocol converter wherein input signals at a first subset of the plurality of terminals are converted to output signals at a second subset of the plurality of terminals, wherein the output signals conform to a different protocol or standard from the input signals. A blade may comprise a battery or speech recognition circuits as examples.

According to another embodiment of the present invention, a companion device for a user is provided and includes separable hardware elements. A first hardware element may comprise a base unit including a battery and equipment for making and receiving phone calls, texting, and email as examples. A second hardware element may comprise an electronic wallet capable of making payments. A third hardware element may comprise an electronic key capable of unlocking and opening a car door, a garage door, a front door of a house, or the like. The companion device may also include a personalized hardware element that is selected from a collection of hardware elements, and the collection may include a multiplicity of potentially useful functions or applications for a user. The companion device may be in a smart watch device format and may be worn like a watch on a user's wrist. One or more of the described hardware elements may be combined with one another, or with other hardware elements. The companion device may comprise a touch/display screen and speech recognition circuits as examples.

According to yet another embodiment of the present invention, a method is provided for reducing or simplifying the complement of devices to be carried by or made accessible to a user. A use-case may be associated with each device. Each device may be transformed from a bulky package having unique interfaces into a stackable blade employing a standard interface. Functions such as power supplies and controllers may be common to many devices, and may be efficiently provided in a single blade. The blades may be coupled using the standard interfaces to form a stack. A first purpose corresponding to a first use case may be executed using a given stack. The stack may then be reconfigured by the user to enable a second purpose corresponding to a second use case. Multiple stacks may be created for different uses or applications, and each stack may comprise a different set of blades. The coupling and uncoupling of blades in a stack may be performed in a user's fingers, without requiring any tools.

According to still another embodiment of the present invention, an electronic system is provided. The electronic system includes a stack of blades, each blade including a standardized smart interface element. Each smart interface element includes a coupling force element, a plurality of terminals, and a micro-controller. The micro-controller manages blade-specific functions and communications between blades, and between blades and devices external to the stack. A user's companion device may include a base device having a battery and simple phone functions, an electronic wallet, and an electronic key. A method is provided for consolidating an eclectic collection of heterogeneous user devices into standardized blade modules that may be conveniently carried and operated in a stacked mobile device having reconfiguration options.

Numerous benefits are achieved by way of the present invention over conventional techniques. For example, "ubiquitous connectivity" is provided by embodiments of the present invention. Many different kinds of heterogeneous devices may be provided with a standardized contact array that enables them to be conveniently coupled together. The devices may be implemented as blade modules in stacked system configurations. The stacked systems may have many different overall form factors, such as a watch format, a phone format, a tablet format, a desktop format, and a docking station format. A wide range of applications may be supported. A health device may include a sensor for determining pollen count, useful to an allergy sufferer; another device may monitor heart rate, blood pressure, or sleep patterns. A quantum processor may be made available to a mathematician. A security device may employ a Trusted Platform Module (TPM), and support reliable methods for exchanging keys. The information contained in blade modules may be encrypted so that the data is not at risk if the blade is lost or stolen. Blades in a small format may be embedded in jewelry and in other wearable devices. For a family leaving on vacation or a businessman leaving on a trip, customized systems may be created using temporary stacks of selected modules. Commercial banks may employ docking stations that accept a user's blade for authentication, or for documenting a transaction.

A further benefit provided by embodiments of the present invention is that a user may carry or own fewer discrete devices, while improving their lifestyle and convenience. Each of the discrete devices may comprise an odd sized box, each box containing a power supply and a separate controller. The boxes may be bulky. The stacked devices may be smaller and lighter. Thus a user may create a personalized electronic ecosystem that is light weight and convenient. The multiple power supplies and controllers may be implemented as a single battery and a single controller provided in a single base module. Each of the required functions may be implemented in a blade module that is then coupled to the base module, or to the stack containing the base module. This efficient allocation of resources may enable the stacked versions to be less expensive than the discrete ones they replace. Furthermore, a library of selectable blade modules may bring to users new flexibility in how they obtain and use devices. They may be rented or leased for example, instead of purchased, and the user may be assured of device compatibility because of the standard coupling interface employed. Using a standardized smart interface element in each device enables the convenience of interoperability between any pair of devices. Additionally, the coupling and uncoupling of devices may be "hot swappable," providing further convenience to the user by reducing or eliminating shut down procedures in many cases. Furthermore, an ecosystem of electronic devices that are physically connected rather than wirelessly connected, according to many embodiments described herein, may be more secure and less vulnerable to malicious attacks.

A person may attend a social function and have their electronic necessities carried in a single discreet and low profile device. For example, the necessities may include a phone, a device for making payments, and a device for opening locked doors. The phone may be implemented as a base module that is thin because it is required to support only basic phone functions; the payment device and the electronic key may be implemented in thin blades that conveniently couple with the base module. The entire package may be presented as a thin and unobtrusive mobile device, or worn like a watch for example. These and other embodiments may be combined and used in many ways that will be apparent to skilled practitioners of the art. These and other embodiments of the invention along with many of its advantages and features are described in more detail in conjunction with the text below and attached figures.

Various embodiments of the present invention are described hereinafter with reference to the figures. It should be noted that the figures are only intended to facilitate the description of specific embodiments of the invention. They are not intended as an exhaustive description of the invention or as a limitation on the scope of the invention. In addition, an aspect described in conjunction with a particular embodiment of the present invention is not necessarily limited to that embodiment and may be practiced in other embodiments. Additional embodiments may be achievable by combining the various elements in different ways. For example, various types of contact arrays and smart interface elements may be combined with multiple types of devices. As a further example, various forms of the coupling force elements may be interchanged, and they may comprise single or multiple elements of each type in a particular contact array.

DETAILED DESCRIPTION OF THE INVENTION

Figure 1A:
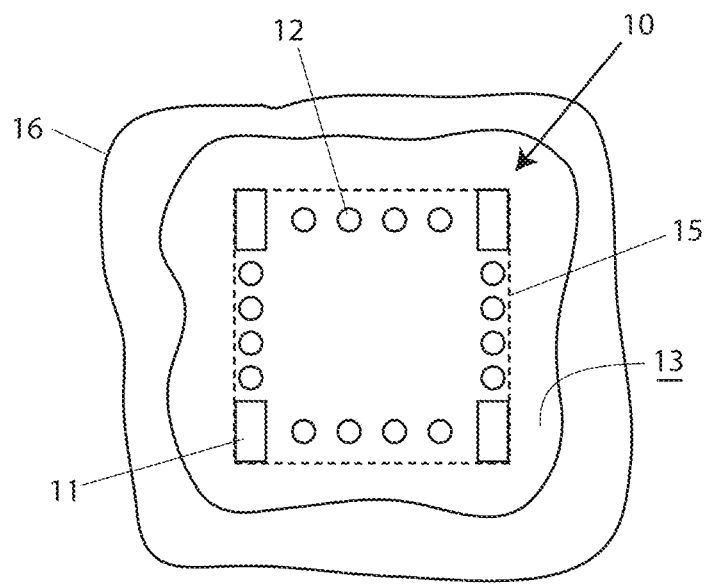
FIG. 1A is a plan view of a contact array employing magnets and terminals in a rectangular format according to an embodiment of the present invention.

FIG. 1A shows a plan view of a coupling face 13 of a device, depicting contact array 10 comprising four magnets 11 and sixteen terminals 12. Coupling face 13 has an associated coupling area 15, including a periphery around magnets 11 and terminals 12, and is contained within a body 16 of a device as shown. The magnets 11 are configured so as to provide a coupling force between host devices equipped with like contact arrays. A host device may be defined as any device to which a second device or module may be coupled. A type of rare earth magnet called a "neodymium magnet" comprises Neodymium (Nd), Iron (Fe) and Boron (B), and a suitable magnet size for the contact array may be around 4 mm×2 mm×1 mm. Any type of magnet may be used, including an electromagnet, typically comprised of an iron core and a winding, wherein the electromagnet is activated by passing a current through the winding. Opposing contact arrays comprising four such magnets in each host device may have a breakaway force of approximately 1 lb, a force that is easily managed in a user's fingers.

Terminals 12 may support high speed data, power, control, and addressing for example. Although 16 terminals 12 are illustrated in FIG. 1A, embodiments of the present invention are not limited to this particular number and other numbers of terminals can be utilized. Data streams may flow between any and all combinations of host devices and ancillary devices, including host-to-host, host-to-ancillary, and ancillary-to-ancillary devices. An ancillary device may be defined as any device having a support function in relation to a host device. Multiple streams of data may flow simultaneously through a contact array or a smart interface element.

Figure 1B:
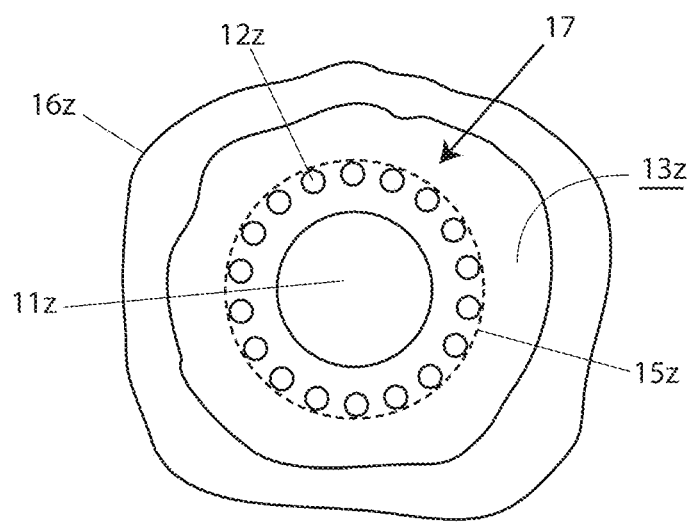
FIG. 1B is a plan view of an alternative contact array employing a single magnet and terminals according to an embodiment of the present invention.

FIG. 1B is a plan view of an alternative contact array 17 employing a single magnet 11z and 18 terminals 12z according to an embodiment of the present invention. Magnet 11z and terminals 12z are disposed in coupling face 13z and coupling area 15z is shown. Contact array 17 has a circular format and magnet 11z provides the coupling force. Coupling face 13z is contained within the body 16z of a device. As illustrated, the dimensions of the coupling face and the body are independent of each other with the coupling face being a portion of a larger attachment surface associated with the body, to be further described in reference to FIGS. 8-10.

Figure 1C:
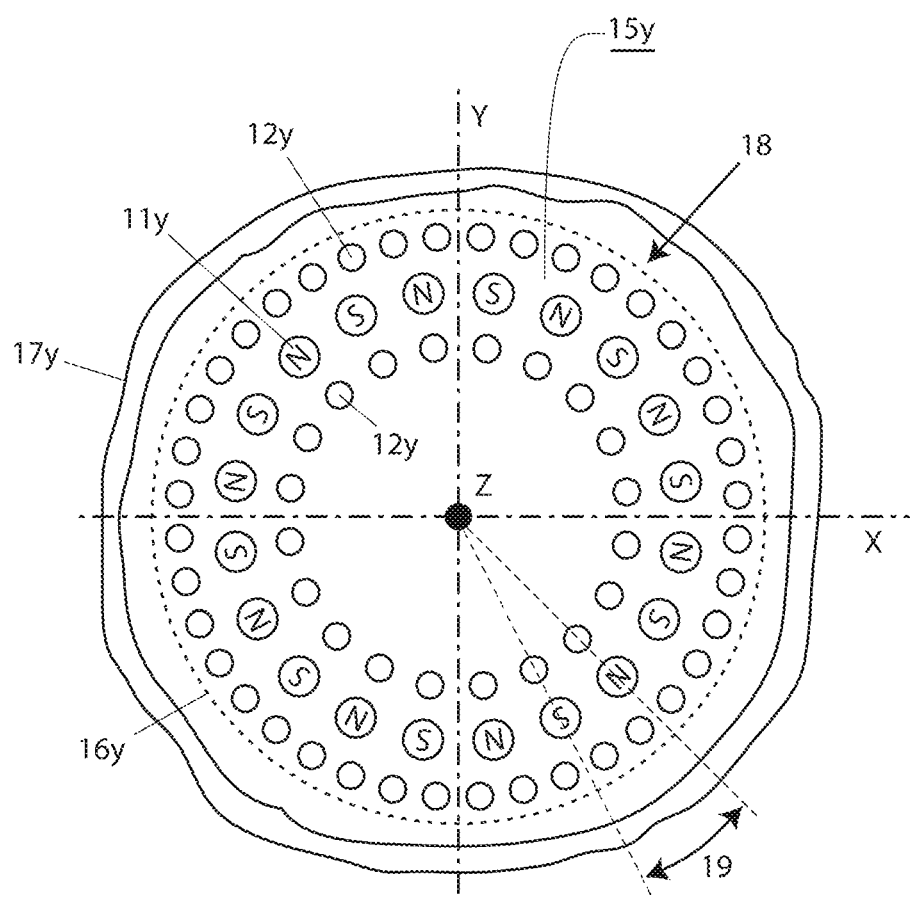
FIG. 1C is a plan view of an alternative contact array employing higher order symmetries, according to an embodiment of the present invention.

FIG. 1C is a plan view of an alternative contact array 18 employing 20 magnets 11y and 60 terminals 12y in a configuration having multiple levels of symmetry. Except for reversed magnet polarities, the array of magnets 11y and terminals 12y exhibits reflection symmetry about each of the X and Y axes. Thus, the embodiment illustrated in FIG. 1C demonstrates complementary magnetic symmetry since each magnet in each pair has an associated magnet in the pair equidistant from each of the bisectors and with the opposing polarity. The X and Y axes pass through a center point (labeled by orthogonal axis Z) of the contact array. Each of these symmetries is a two-fold symmetry, since there are two positions that satisfy the coupling requirement, each corresponding to a 180° rotation. Contact array 18 also exhibits ten-fold rotational symmetry, wherein the angular segment 19 may be placed in ten alternative angular locations, each obtained from the previous one by a 36° rotation around the Z-axis. Contact array 18 has the advantage of an increased number of high-current connectors in the form of magnets 11y, and more terminals such as 12y, providing more input/output pins for setup and control and potentially higher bandwidth communications between coupled devices. Since array 18 has 14-fold symmetry, many options may exist for coupling with other devices. For example, devices of lower order symmetry may be coupled with devices of higher order symmetry, wherein a lesser number than the complete complement of magnets and terminals may be provided in the device having the lower order symmetry.

Figure 2A:
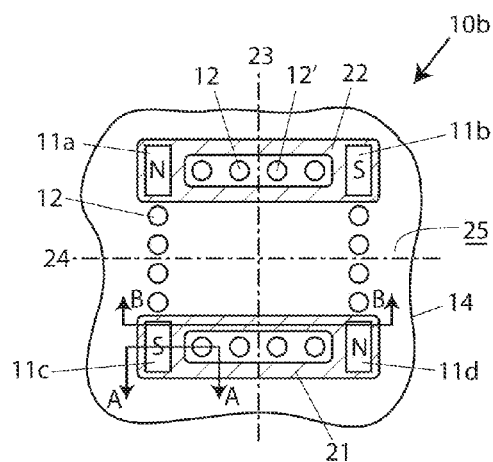
FIG. 2A is a plan view of a portion of a coupling face of a device containing a contact array comprising magnet pairs fitted with magnetic field containment devices according to an embodiment of the present invention.

FIG. 2A shows a portion of a coupling face 25 of a device, depicting a modified contact array 10b coupled to a substrate 14. Contact array 10b comprises two pairs of magnets oriented as shown. Either individual magnets or commoned pairs of magnets may be used as high current terminals. The use of a set of magnets that are electrically commoned to provide a single commoned electrical connector may overcome uncertainty relating to fit between opposing contact arrays, including small gaps between opposing magnets that may occur due to manufacturing tolerances. The risk of gaps may be mitigated by providing substrate 14 in semi-rigid or flexible form; substrate flexure may enable each of the magnets to make contact with its opposing magnet, especially if the gaps are small.

Inter-connectable modules that are essentially planar may be called blade modules, each an individual blade. In a relatively thin blade module, magnets 11 and terminals 12 may extend through substrate 14 so as to be operable on each side of the blade. Such a module may be around 1 mm thick for example. In a relatively thick blade module, a separate contact array may be provided on each of the two faces of the module.

Further referring to FIG. 2A, magnetic field containment device 22 straddles magnet pair 11a and 11b, and magnetic field containment device 21 straddles magnet pair 11c and 11d. Additional description related to the magnetic field containment devices will be described in reference to FIG. 4. In contact array 10b, magnets 11a and 11d comprise a north pole, and magnets 11b and 11 c comprise a south pole. As illustrated in FIG. 2A, each of the terminals 12 has a matching terminal equidistant from the vertical and horizontal bisectors. In other embodiments, this symmetry is only provided with respect to one of the bisectors.

Figure 2B:
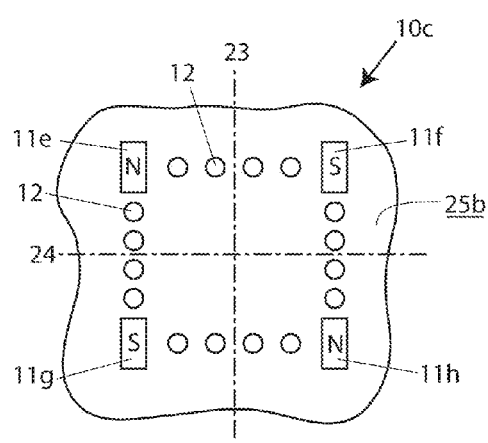
FIG. 2B is a bottom view of the portion of the device depicted in FIG. 2A.

FIG. 2B shows coupling face 25b on the opposite side of the device of FIG. 2A. It can be seen that the placement and polarities of magnets 11e, 11f, 11g, and 11h in contact array 10c of FIG. 2B cannot be distinguished from the placement and polarities of magnets 11a, 11b, 11c, and 11d in contact array 10b of FIG. 2A. This similarity may apply if magnets 11e-11h are distinct from magnets 11a-11d; it may also apply if magnet 11e is the opposite end of magnet 11b, magnet 11f is the opposite end of magnet 11a, magnet 11g is the opposite end of magnet 11d, and magnet 11h is the opposite end of magnet 11c, for the case of a relatively thin device wherein the magnets extend through the device, from one side to the other.

The symmetry of the magnet poles and placements shown in FIGS. 2A and 2B ensure that like contact arrays provided in host devices and ancillary devices will spontaneously couple with an attractive force. If two devices to be mated each have a contact array in a rear face, one of them can be rotated 180° from a face-up starting position to effect a coupling. Then each magnetic pole in the contact array will be opposed by its opposite or complementary pole. Accordingly, the term complementary magnetic symmetry is used herein to describe this geometric arrangement. Complementary magnetic symmetry for an array of magnets comprises reflective symmetry about a bisector (e.g., a bisecting plane) except that the magnet poles on opposite sides of the bisector are reversed.

Referring to FIG. 2A, vertical center line 23 is a vertical bisector of contact array 10b, and also corresponds to a bisecting plane of the contact array. Horizontal center line 24 is also a bisector of contact array 10b, and again corresponds to a bisecting plane of the contact array. It can be seen in FIGS. 2A and 2B, with respect to each of the bisecting planes, that the magnets are arrayed with complementary magnetic symmetry and the terminals are arrayed with reflective symmetry, i.e., terminal 12 and terminal 12' are equidistant from vertical center line or bisector 23. This combination of symmetries enables spontaneous coupling of devices or modules employing the standard contact array, in any orientation wherein corresponding coupling faces are presented. This will enable individual modules to be coupled with other individual modules, and also a first stack of modules to be coupled with a second stack of modules, wherein some of the modules (especially a touch/display module on the top of a stack) may have a contact array in only one coupling face.

Certain orientations of coupled devices may result in a different pinout in effect for a particular contact array in a particular module. A "pinout" can be considered as a cross-reference between the contacts of an electronic component and its functions. The different pinouts may be used to support planned couplings, wherein a first pinout may be used in a first application and a second pinout in a second application. The input/output pins of integrated circuit chips (ICs) contained in such modules may be specially configured for multiple pinout options. For example, they may comprise bi-directional tri-state circuits. They may be supported by software that determines the direction and impedance state for each pin in a carefully controlled manner, in order that no damage occurs to the circuits in the modules, and effective communication between modules is achieved. Furthermore, the choice of acceptable orientations may be intentionally limited in order that multiple pinouts are not enabled or not required; one way to limit the acceptable choices would be enabled by keyed configurations of the modules for example.

Figure 2C:
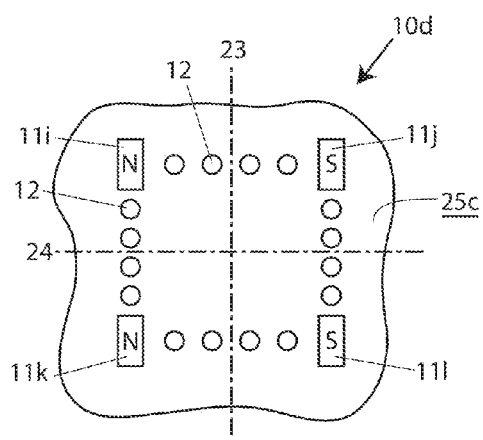
FIG. 2C is a plan view of an alternative magnetic symmetry in a contact array according to an embodiment of the present invention.

FIG. 2C depicts an alternative way to limit the acceptable coupling orientations. Contact array 10d is similar to contact array 10b of FIG. 2A except that the magnetic symmetry is different. Complementary magnetic symmetry is observed about vertical center line 23, but not about horizontal center line 24, for which simple reflective symmetry is observed. Accordingly, a pair of modules employing contact array 10d will spontaneously couple in an orientation wherein the second device is rotated around vertical center line 23 with respect to the first device, but will repel one another in an orientation wherein the second device is rotated around horizontal center line 24. This limiting of acceptable coupling orientations may be desirable, enabled by the different symmetry of FIG. 2C. In addition, a full complement of terminals may be used at a first interface between modules, and a subset of terminals may be used at a second interface between modules, while implementing at least portions of a standard protocol governing behaviors at both the first and the second interfaces.

Figure 3:
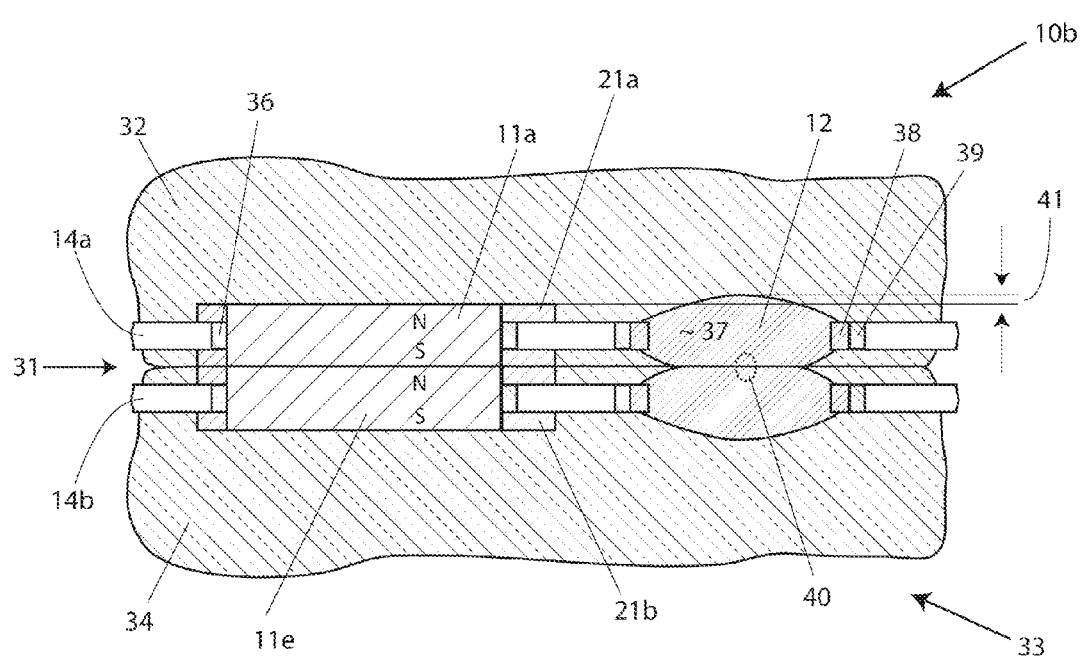
FIG. 3 is an expanded cross-sectional view of section AA of FIG. 2, at an interface with an opposing coupled module.

FIG. 3 illustrates an expanded cross section corresponding to section AA of FIG. 2. Interface 31 is shown between a portion of a first contact array such as 10b associated with host device 32 and a corresponding portion of a like contact array 33 associated with an opposing host device 34. Host device 32 may represent an attachable module and host device 34 may represent a receiving device for example. Again, it can be seen that the poling of the magnets provides for an attractive coupling force while using identical contact arrays. Contact arrays 10b and 33 are configured to support a "snap-on" "snap-off" characteristic for coupling and uncoupling, respectively. Each coupling event may be conveniently accomplished by a user, employing his or her fingers only, with no tools and no cables or cable connectors required. In some contexts, it may be beneficial to replace the magnet on the second side of the interface with a component other than a magnet, such as a disk comprising a material of high magnetic permeability, while retaining the snap-on snap-off capability.

Each host device comprises a substrate such as 14a and 14b in some embodiments. Magnet bodies are typically conductive, and magnets typically have an electroplated outer surface that is also electrically conductive, and they may be used as electrical terminals using a press fit for example in a feedthrough such as via 36 in substrate 14a. A terminal 12 may comprise a body 37 of conductive rubber molded within a conductive ring 38 and the supportive conductive ring 38 may be soldered or press fit in a feedthrough such as via 39 in substrate 14a. As shown at location 40, each terminal may compress at the interface with an opposing terminal so as to be contained in the available space between contact arrays, assuming direct contact of the magnets.

Other types of compliant terminals may also be used, each type typically comprising a compliant conductive member on at least one side of the interface. The terminals on the other side of the interface may comprise hard elements such as, metal disks for example. The body of the compliant terminal may comprise conductive rubber for example, as shown in FIG. 3, or it may comprise a dome-shaped deflectable conductive membrane (not shown) as a further example. POGO pins comprising spring loaded contacts may also be used as terminals. Other types of terminals and compliant connectors will be apparent to practitioners of the art. One of ordinary skill in the art would recognize many variations, modifications, and alternatives.

In certain contexts it may be beneficial that devices such as host devices 32 and 34 illustrated in FIG. 3 are capable of communicating through the terminals and/or the magnets without the need, in some embodiments, for the use of radio frequency (RF) signals passing between the system components. As will be evident to one of skill in the art, the presence of radio signals may present a vulnerability to detection by RF sniffer circuits for example, and this may pose a security risk to the user. Thus, embodiments of the present invention, utilizing wired communications between devices, provide solutions that are not readily available using wireless communications technology and protocols. One of ordinary skill in the art would recognize many variations, modifications, and alternatives.

Figure 4:
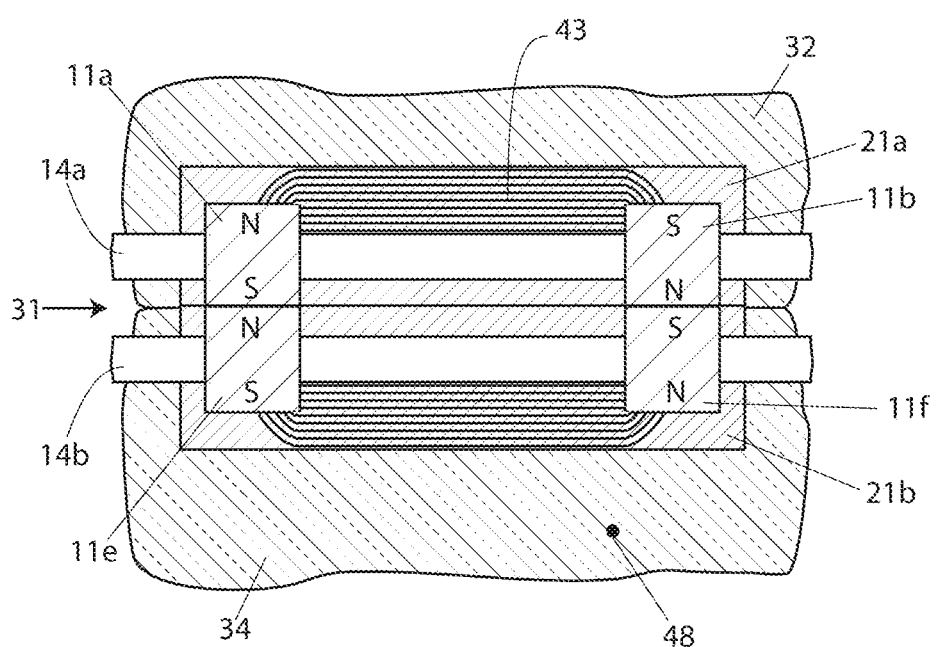
FIG. 4 is an expanded cross-sectional view of section BB of FIG. 2 at an interface with an opposing coupled module, with a further expanded vertical scale to show detail of magnetic field lines.

FIG. 4 schematically depicts section BB of FIG. 2A and shows the effect of magnetic field containment devices such as devices 21a and 21b at a coupling between contact arrays disposed in host devices 32 and 34. Magnetic field containment devices 21a and 21b are disposed between and optionally around the magnets of a magnet pair comprising a north and a south pole. Typically, the devices include a material of high magnetic permeability. Referring to FIG. 4, magnetic field lines 43 pass between the magnets in each pair, indicating the region where the magnetic field strength is strongest. At location 48, which is located inside host device 34 and can be internal to interface 31, the magnetic fields produced by magnet pair 11e/11f are reduced, making this location suitable for placing sensitive magnetic sensors and electronic circuits. It should be noted that at locations such as location 48, the effect of magnets such as 11a, 11b are also reduced.

Using magnetic field containment devices 21a and 21b, the magnetic field at location 48 due to magnets 11e/11f may be reduced to an arbitrary value such as 1% of the earth's magnetic field for example, and this reduced field strength may be low enough that the correct function of magnetic and electronic circuits inside the host devices is not compromised. Devices such as 21a also have the desirable property that they limit far field magnetic effects in a direction outward from the coupling face when a host device is not coupled to another device using the contact array. However, when the host device is coupled to another device using the contact array, the effective coupling force is not substantially diminished by the presence of devices 21a and 21b. This is because the magnetic pathway from a magnet to a directly contacting opposing magnet has a lower reluctance then the magnetic pathway from a magnet to a spaced apart second magnet through a magnetic field containment device such as 21a.

An alternative to providing magnetic field containment devices around magnet pole pairs is to provide magnetic shielding around all components to be protected. The two approaches may also be combined. One of ordinary skill in the art would recognize many variations, modifications, and alternatives.

In certain contexts it may be beneficial to provide mixing and matching of multiple device types as described herein, and also including other device types that may not have been described herein, or may arise in the future. The mixing and matching is made particularly convenient by eliminating the need for cables and cable connectors, by requiring only modest forces that may easily be applied by a user's fingers, and by using an hermaphroditic contact array that is configured to couple with a copy of itself. This characteristic enables a universal interfacing compatibility of devices that each comprise a standard contact array having one of the described symmetries.

Figure 5:
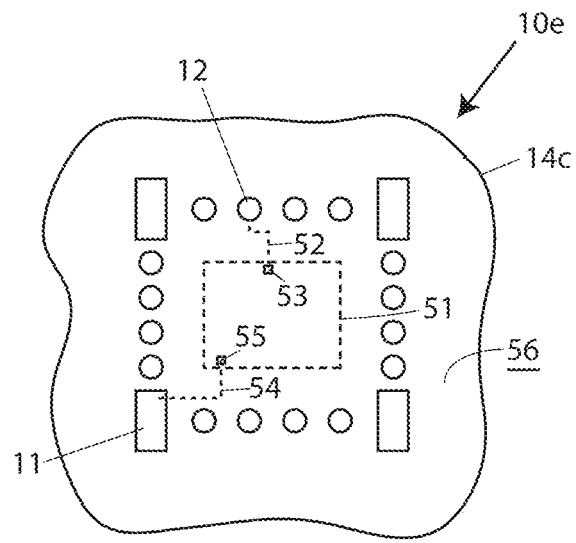
FIG. 5 is a plan view of a contact array/smart interface element further comprising a micro-controller chip and interconnecting elements according to an embodiment of the present invention.

FIG. 5 shows a coupling face 56 comprising a smart interface element 10e comprising a substrate 14c, a micro-controller chip 51, and interconnection elements 52 between terminals 12 and input/output pads 53 of the micro-controller chip. The "intelligence" provided by a micro-controller may enable a contact array to be used as a smart interface element. Interconnection elements 54 may also be provided between magnets 11 used as electrical terminals and other selected input/output pads 55. Micro-controller chip 51 may manage and control communication signals that pass through contact array 10d, which may now be described as a smart interface element. The communication signals may be associated with various combinations of interconnected host devices and ancillary devices for example. Microcontroller chip 51 may also manage device-specific functions. Software associated with micro-controller chip 51 may also be utilized to enable a coupled device to dynamically reconfigure itself as a master or a slave device, depending on the demands of the current application being executed by the coupled devices. A device may signal that it wishes to switch between master and slave by inverting the logic state at one of the terminals for example, and a handshaking protocol may ensue to effect the dynamic reconfiguration.

A smart interface element such as 10e in FIG. 5 may be simultaneously capable of high current and high data rate. High current may be achieved by using magnets as electrical terminals. Their conductivity and size, together with their coupling force, may enable currents between coupled modules of 10 amperes or higher, for example. High data rate may be achieved by using an extended number of terminals and providing a wide data bus. For example, if 32 terminals are dedicated to a bi-directional 32-bit bus, at a clocking rate of 100 MHz a data rate of 3.2 GBytes per second may be achieved. This represents higher overall throughput than provided by a THUNDERBOLT interface at 1.25 GByte per second. Meanwhile the serial data rate of 100 or 200 Mbit per second at each pin, depending on the clocking scheme, may be achievable in the environment of two or more blades coupled together. This environment will typically include variations in contact resistance and other parameters at each of the coupling interfaces. The variations will be increased between blades that are spaced far apart in a stack, wherein a signal passing between the blades may encounter a signal path comprising multiple coupling interfaces.

Figure 6:
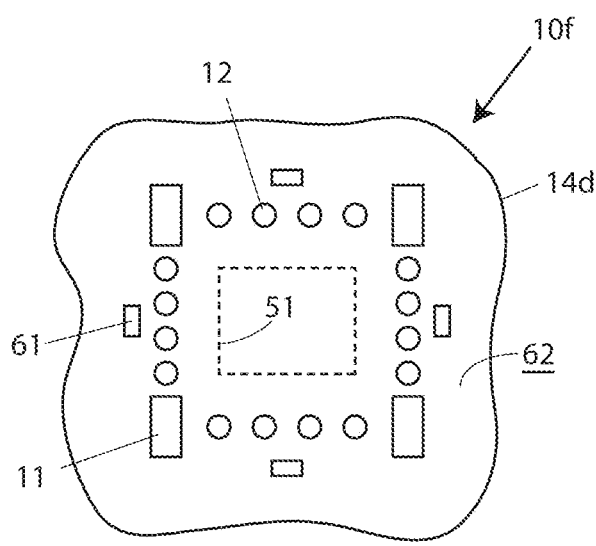
FIG. 6 is a plan view of a contact array/smart interface element further comprising stabilizing tabs according to an embodiment of the present invention.

FIG. 6 shows a coupling face 62 comprising a smart interface element 10f that is similar to smart interface element 10e of FIG. 5, but further comprises stabilizing tabs 61 that protrude from the coupling face 62. Coupling face 62 may comprise a surface of a smart interface element that is included in a host device. Stabilizing tabs 61 may mate with corresponding cavities or recesses in a coupled interface element, corresponding to male and female components, respectively. Stabilization using tabs such as 61 may be important in wearable devices such as a smart watch device, which is subject to a dynamic force environment when worn by a user. The force environment may comprise shocks and impacts for example. Cavities that match the stabilization tabs such as 61 may desirably be present in all forms of the smart interface element, but stabilizing tabs 61 may be optional, provided only in dynamic force environments. An alternative stabilizing feature may comprise retractable fingers (not shown) that are configured to secure each blade module in a stack of coupled blade modules. When a user desires to remove a particular blade from a stack, he or she may initiate unlocking of the retractable fingers by interacting with a touch/display screen provided on one of the blade modules. Other types of stabilizing features may also be used and are within the scope of the invention.

Figure 7:
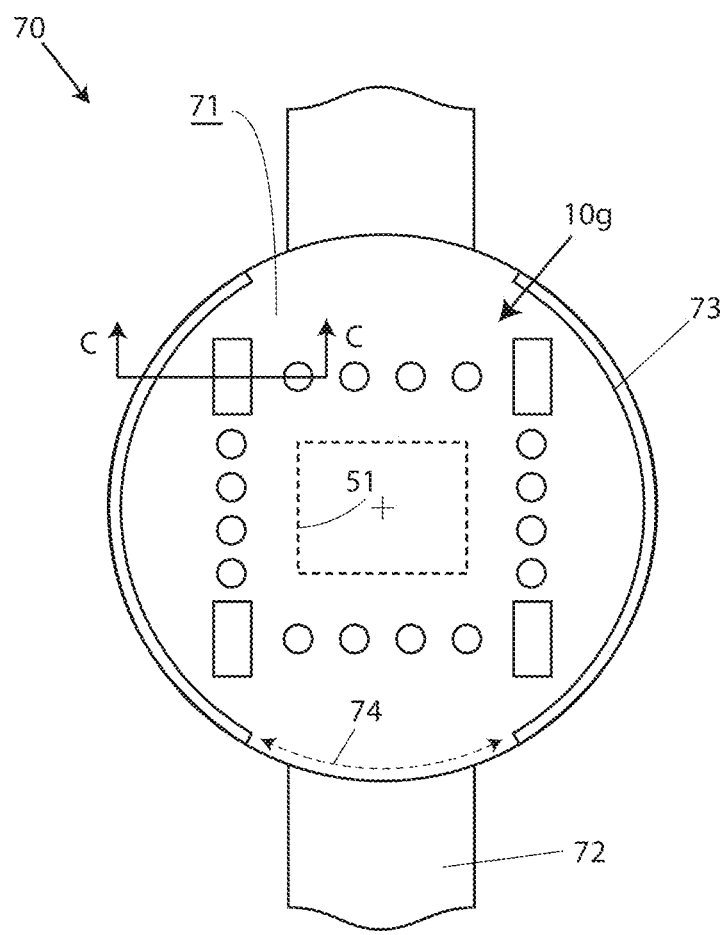
FIG. 7 is a plan view of a face of a smart watch device comprising a contact array/smart interface element according to an embodiment of the present invention.

FIG. 7 shows smart interface element 10g integrated with an intermediate coupling face 71 of a smart watch device 70. Watch band 72 is shown. A circular barrier feature 73 is shown, and it may have cutouts such as 74, to provide finger access for a user to grasp a blade module (not shown) that may be mounted on intermediate coupling face 71 using smart interface element 10g. The blade module or several blade modules configured in a stack of blade modules preferably incorporates the same standardized interface element, 10g in this example. As one example, the blade module may comprise a touch/display panel as the top blade in a stack of blades, and may be responsive to user gestures. The finger access may be utilized for coupling and uncoupling the blade module or modules. Circular barrier feature 73 may have a stabilizing function similar to that provided by tabs 61 of FIG. 6, and will be further illustrated in FIG. 11, which depicts section CC of FIG. 7.

Figure 8:
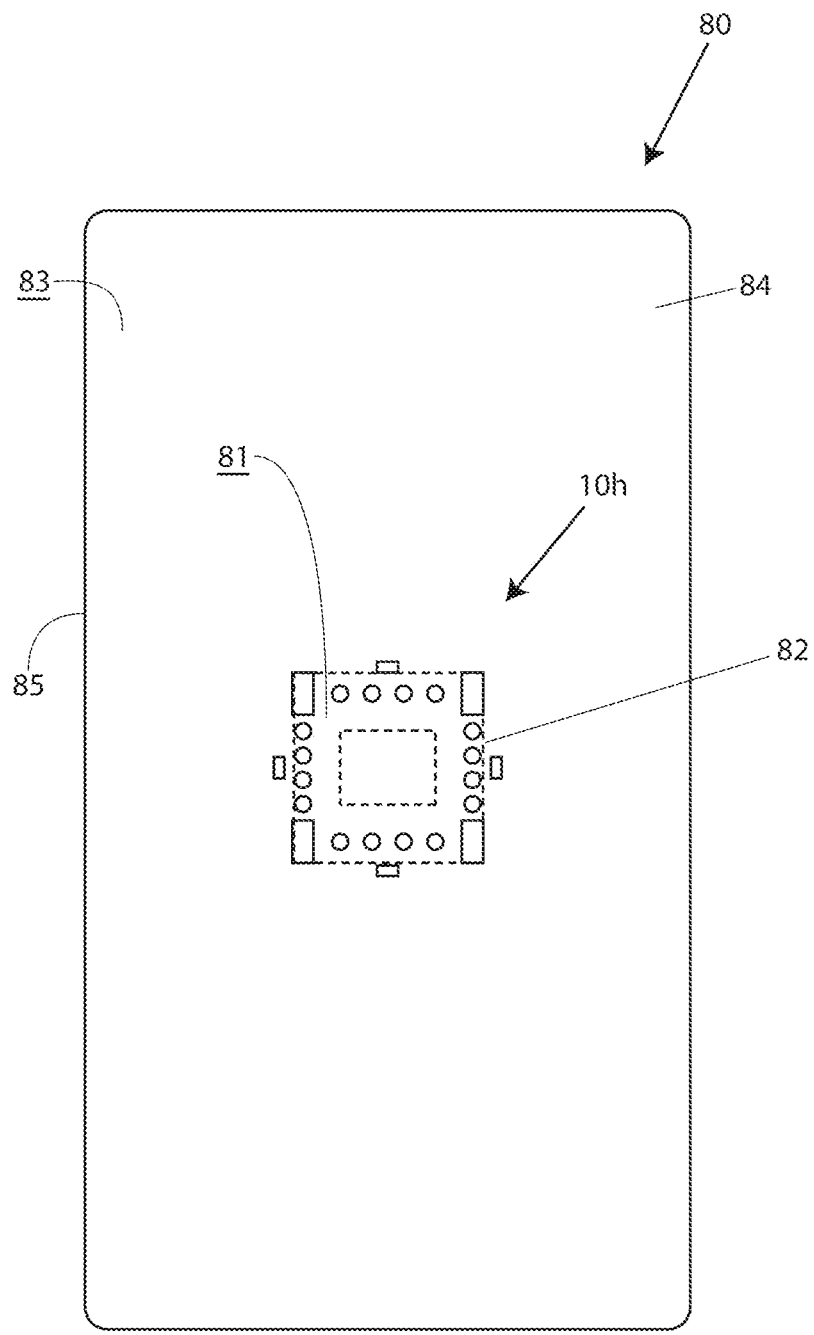
FIG. 8 is a view of the rear face of a smart phone device comprising a contact array/smart interface element according to an embodiment of the present invention.

FIG. 8 shows smart interface element 10h provided in a rear coupling face 81 of a smart phone device 80. Thus smart phone device 80 is configured to accept a smart watch blade module for example, having a smart interface element such as 10e or a similar smart interface element of the female variety (not shown) that has recesses operable to accept stabilizing tabs 61 of FIG. 6 or barrier features 73 of FIG. 7. Alternatively, the module to be attached may have a diameter small enough to fit inside a barrier feature such as circular barrier feature 73 in the example illustrated in FIG. 7. This connection of a smart watch device module to a smart phone device may be desirable for charging the watch module, for syncing the two devices, or for creating a trusted pair relationship between the two devices as non-limiting examples.

Referring to FIG. 8, although the rear coupling face 81 of the device 80 is illustrated, it will be appreciated that the device 80 includes a device body 85 and an attachment face 83 defined by an attachment area 84. In the example illustrated in FIG. 8, the attachment area is defined by the periphery the device body. The contact array 10h is disposed in the device body and exposed at the coupling face 81. In the embodiment illustrated in FIG. 8, the contact array includes one or more magnets disposed on the coupling face and a plurality of terminals disposed on the coupling face. The periphery of the one or more magnets and the plurality of terminals define a coupling area 82. Referring to FIG. 1A, the square defined by magnets 11 defines the coupling area 15. In FIG. 8, the coupling area 82 can have a periphery with sides that have lines aligned with the outer edges of the magnets and/or the terminals. Attachment area 84 is greater than coupling area 82 and is independent of the coupling area, providing designers with flexibility in defining the device dimensions. Thus, as illustrated in FIGS. 8-10, different devices with different attachment areas are provided, but all are using the standardized contact array.

Figure 9:
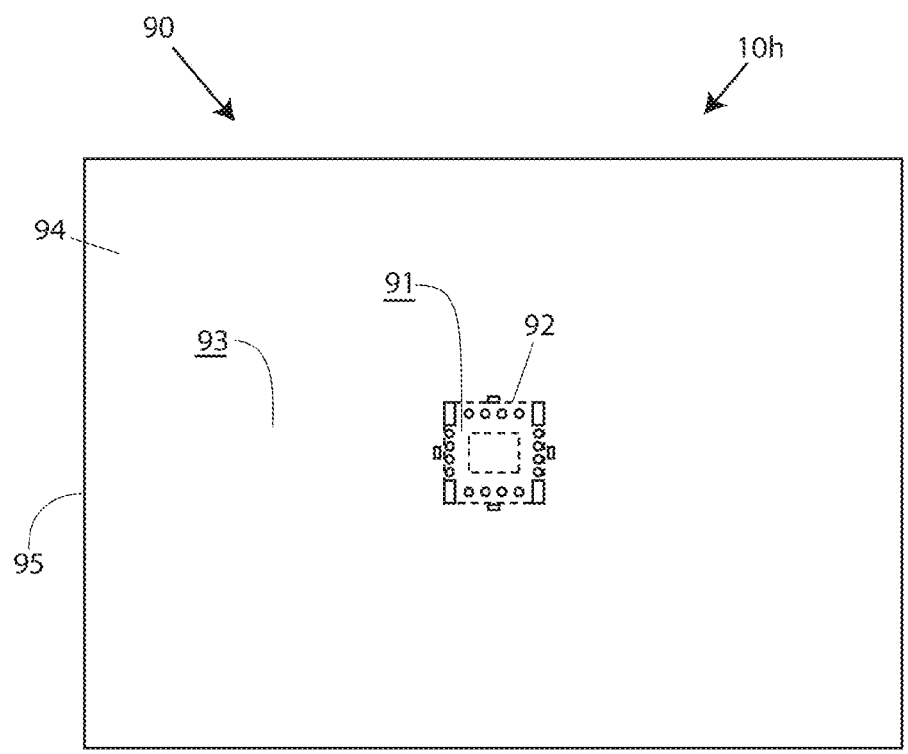
FIG. 9 is a view of the rear face of a tablet device comprising a contact array/smart interface element according to an embodiment of the present invention.

FIG. 9 illustrates smart interface element 10h provided in a rear attachment face 93 of a tablet device 90. Attachment face 93 has an attachment area 94 defined by the periphery of the device body 95. Smart interface element 10h is disposed in a coupling face 91 that is associated with a coupling area 92 defined by the periphery of the magnets and terminals in the interface element. Other devices that may couple with tablet device 90 using interface element 10h may include smart watch device modules or smart phone devices as previously described, each one comprising a matching smart interface element 10h. It may be imagined that smart phone device 80 may act as a "mother device" to a blade module of smart watch device 70, and tablet device 90 may similarly act as a mother device to both a blade module of smart watch device 70 and to smart phone device 80, providing power and other resources as required. In each case the blade module may be replaced by a stack of blade modules, at the user's convenience. Connections among and between these different classes of devices may be accomplished easily and conveniently by a user, not typically requiring any tools, and by simple manipulation of the host devices in the user's fingers. The device coupling preferably comprises a "snap on" characteristic, and the device uncoupling preferably comprises a "snap off" characteristic. The snap on action occurs when mating contact arrays are moved into proximate alignment, whereupon the coupling forces imparted by the coupling force elements pull the contact arrays and the host devices together, in a snap on action. A snapping sound may be heard. Comparing FIG. 8 and FIG. 9, the attachment area 84 (which may also be referred to as a coupling area) and the attachment area 94 (which may also be referred to as a coupling area) are different. Because the contact arrays are standardized, these different sized devices, with different attachment areas, can be joined to form an integrated device.

Figure 10:
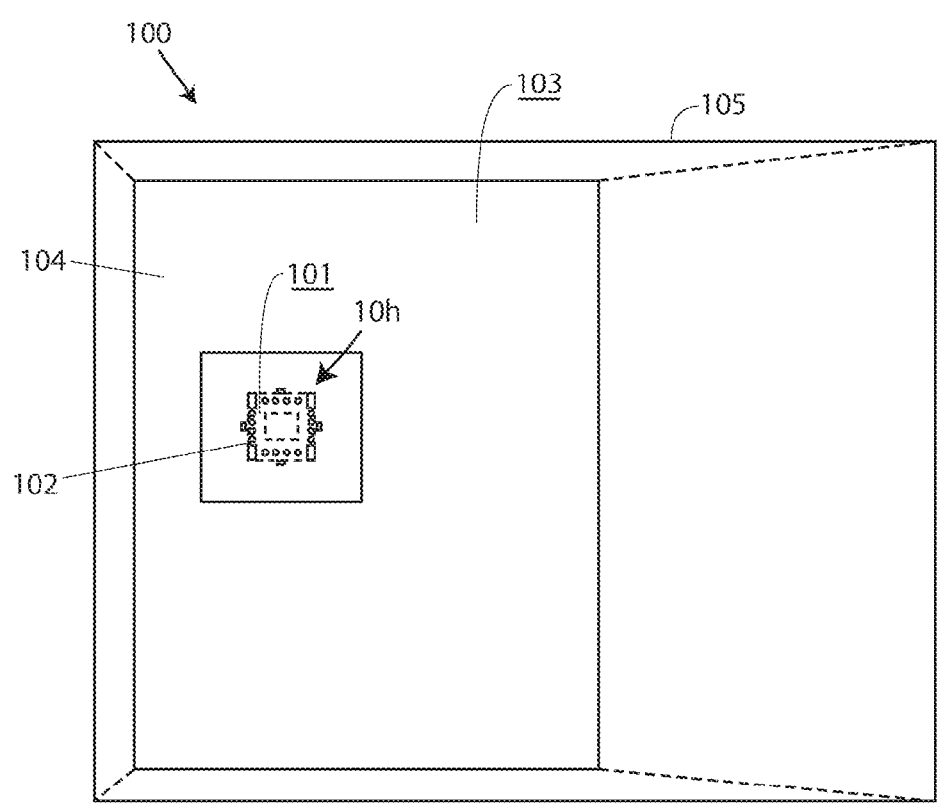
FIG. 10 is a front view of a large system comprising a contact array/smart interface element as an element of a docking station device according to an embodiment of the present invention.

FIG. 10 shows smart interface element 10h provided as an element of a docking station device in an electronic system 100. Electronic system 100 may comprise a supercomputer, an automobile dashboard, a home television (TV) set, an airplane TV, or an automatic teller machine (ATM) as non-limiting examples. For the case of a supercomputing system, body 105 may be a building, and attachment face 103 may be a front wall of the building. The attachment area 104 may be a raised or recessed portion of the front wall for example. Smart interface element 10h is disposed in a coupling face 101 associated with a coupling area 102 comprising the periphery of the magnets and terminals. Coupling face 101 may be coplanar with attachment area 104, or may be offset from it or otherwise different. By decoupling the dimensions and surfaces of the smart interface element from the dimensions and surfaces of the parent body, maximum flexibility is provided for embodying a standard interface element in bodies of different sizes and configurations. Many other sizes and configurations will be apparent to practitioners of the art.

Electronic system 100 may serve as a mother device to tablet devices, smart phone devices and watch modules as an example of ubiquitous connectivity, wherein all of the mating devices comprise a version of a standardized contact array or a standardized smart interface element, and all of them may be coupled and uncoupled using a snap-on, snap-off characteristic, respectively.

The described snap on and snap off coupling may be "hot swappable", wherein the devices may be coupled or uncoupled by a user spontaneously, without requiring a preceding power down sequence. This hot swap capability may be enabled by low voltage and low current operations of mobile devices. A capacitor (not shown) may be provided for storing energy; this energy may enable the microprocessor of the smart interface element to continue to operate, for a sufficient number of cycles to gracefully terminate any operations in progress. The capacitor may be a "super capacitor". In order to minimize arcing, and in support of the hot swap capability, current limiting circuits may be used in potentially higher current situations such as battery charging. In addition, prior to coupling, software residing in the micro-controller may configure the input/output pins to be in a low current mode. Alternatively, the input/output pins of each device may be set to the low current mode as a default condition. During the coupling process, the resident micro-controllers may execute a "preamble sequence". The preamble sequence may comprise handshake operations to determine an agreed address for each device, and the identity of a single master device in the set of coupled devices. Near the end of the preamble sequence, the master micro-controller may initiate a sequence wherein the states on the input/output pins of the coupled devices are asserted in a normal current mode.

Figure 11:
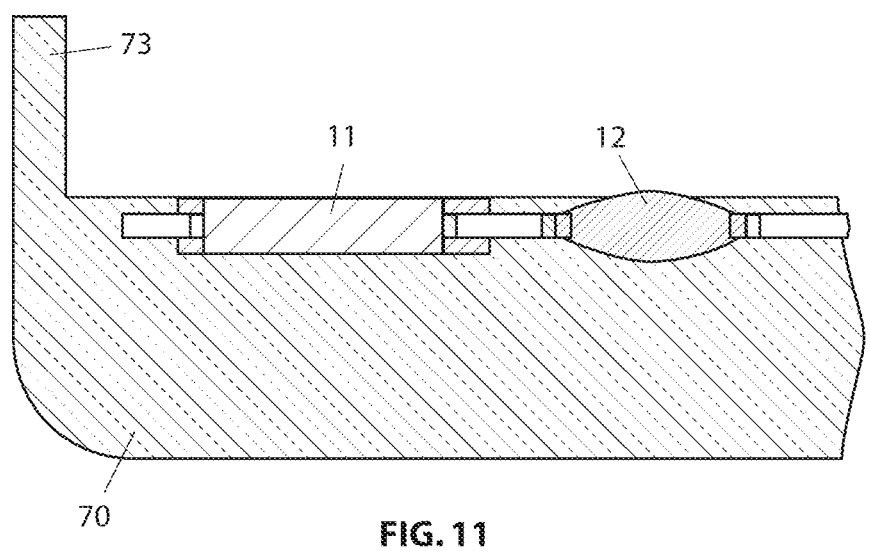
FIG. 11 is an expanded cross-sectional view of section CC of FIG. 7.

FIG. 11 is an expanded cross-sectional view of section CC of FIG. 7. Magnet 11 and terminal 12 are shown. Circular barrier element 73 illustrated in FIG. 7 is also shown. Barrier element 73 may assist in providing a more secure attachment of a blade module to smart watch device 70. In concert with coupling force elements provided in the base watch module and the companion blade module, barrier element 73 may protect against unwanted uncoupling during vigorous motions of the user's wrist, and also during vibrations and shocks that may be transmitted to the coupled assembly during use.

Figure 12A:
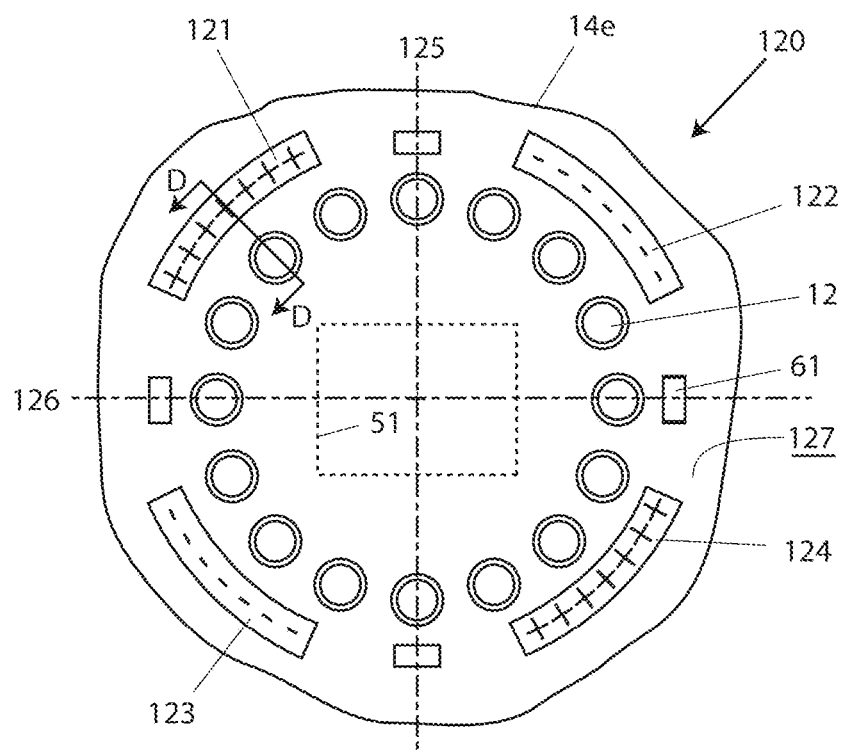
FIG. 12A is a plan view of an alternative smart interface element embodying regions of embedded electric charge as coupling force elements in a circular format according to an embodiment of the present invention.

FIG. 12A shows a coupling face 127 depicting a circular format for an alternative embodiment 120 of a smart interface element comprising a substrate 14e, a micro-controller chip 51, terminals 12, stabilizing tabs 61, and regions of embedded electrical charges 121-124 as an alternative to magnets. Regions 121 and 124 comprise positive charges, and regions 122 and 123 comprise negative charges. The electrical polarities and placements of charges shown in FIG. 12 ensures that like contact arrays embodied in host devices will spontaneously couple with an attractive force. As previously discussed, if two devices to be mated each have a contact array in a rear face, one of them can be rotated 180° from a face-up starting position to effect a coupling. If this is done, each charge region in a contact array will be opposed by its opposite or complementary charge region. Accordingly, the term complementary electric symmetry is used herein to describe some embodiments. Complementary electric symmetry for an array of electrical charge regions comprises reflective symmetry about a bisecting plane except that the charge regions on opposite sides of the bisecting plane are reversed. Center line 125 in FIG. 12A is a vertical bisector of smart interface element 120, and also denotes a bisecting plane. Center line 126 is a horizontal bisector of smart interface element 120, and again denotes a bisecting plane. It can be seen in FIG. 12A that with respect to each of the bisecting planes, the charge regions are arrayed with complementary electric symmetry and the terminals are arrayed with reflective symmetry. This combination of symmetries enables spontaneous coupling of devices or modules employing this contact array as a standard, in any orientation wherein corresponding coupling faces are presented. Terminals 12 are shown with reflective symmetry about both bisecting planes.

Figure 12B:
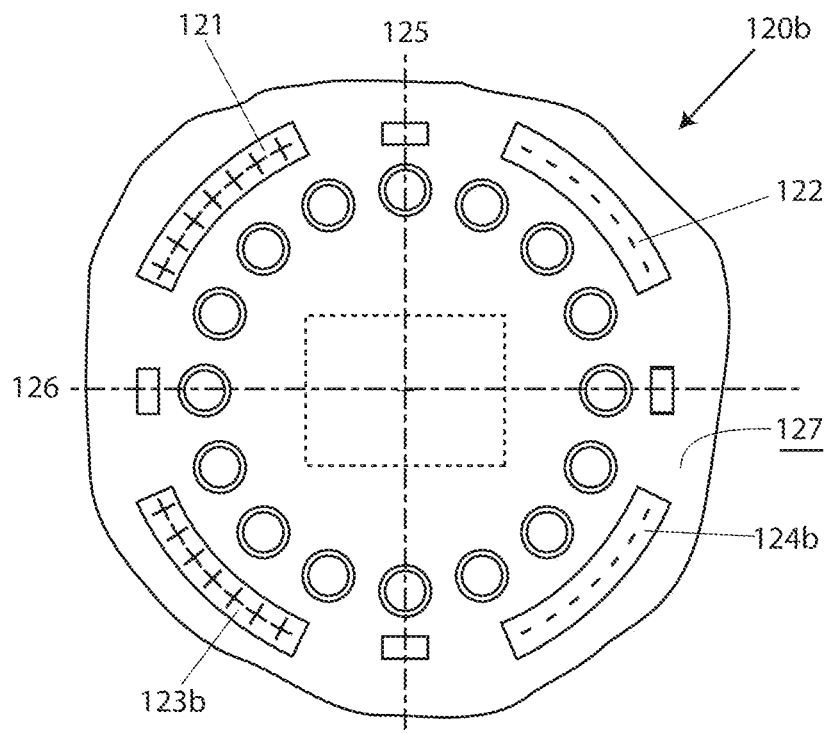
FIG. 12B is a plan view depicting an alternative symmetry to that shown in FIG. 12A, for the regions of embedded charge according to an embodiment of the present invention.

FIG. 12B shows smart interface element 120b, which is similar to interface element 120 of FIG. 12A, except that the symmetry of the electric charge regions is different. Complementary electric symmetry is observed about bisecting plane 125, but not about bisecting plane 126, for which simple reflective symmetry is observed. Accordingly, modules employing version 120b of the smart interface element will spontaneously couple in an orientation wherein the second device is rotated around axis 125 with respect to the first device, but will repel one another in the orientation wherein the second device is rotated around axis 126. This selective coupling may be desirable, corresponding to the different symmetry of FIG. 12B.

Figure 13:
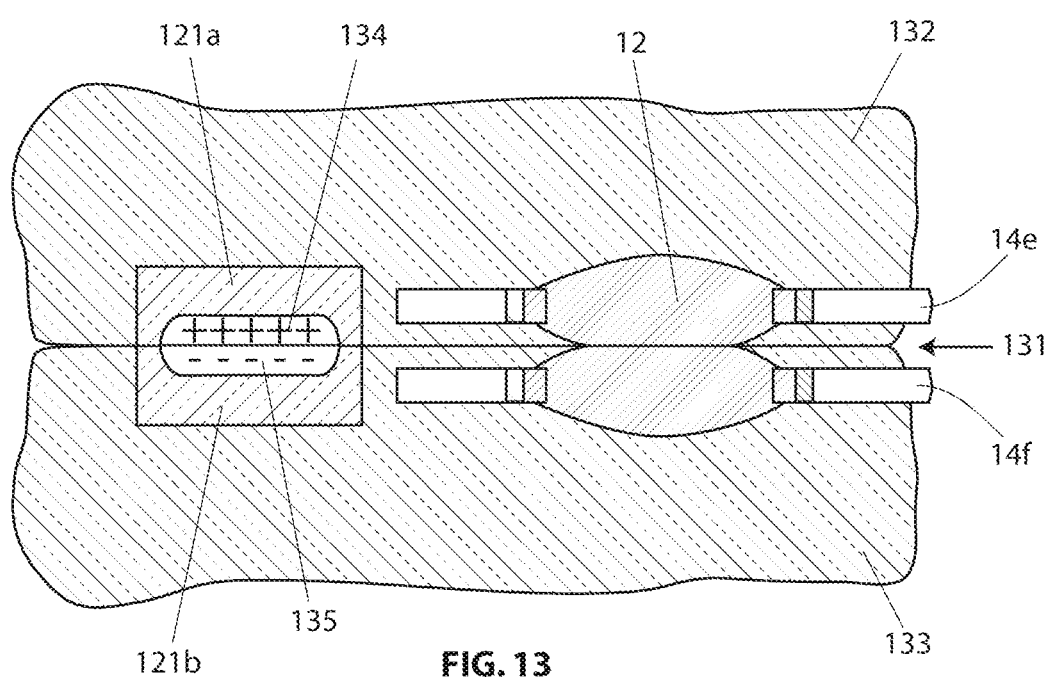
FIG. 13 is an expanded cross-sectional view of section DD of FIG. 12, at an interface with an opposing coupled module.

FIG. 13 shows interface 131 between host devices 132 and 133 corresponding to section DD of FIG. 12A. Interface 131 may comprise opposing coupling surfaces of an attachable coupling module and a receiving coupling device respectively. Each attachable module and receiving device may comprise terminals 12 as previously described. Interconnection substrates 14e and 14f are shown. Host device 132 comprises coupling force element 121a which further comprises embedded positive electrical charges 134. Host device 133 comprises coupling force element 121b which further comprises embedded electrical charges 135 that are opposite in sign to those of element 134, in this case negative. The embedding of electrical charges may be accomplished by an ion implantation process for example. Additional description related to the embedding of electrical charges is provided in U.S. patent application Ser. No. 13/477,965, entitled "Method for Controlling the Coupling and Friction between Opposing Surfaces", the disclosure of which is hereby incorporated by reference in its entirety for all purposes.

The collective coupling force of all of the coupling force elements such as 121a and 121b at an interface between contact arrays may result in a preferred breakaway force of around 1 lb for example. In some embodiments it may be beneficial to replace the charged region on the second side of the interface with a conductive element in which pre-embedded charge is not present; on coupling of the two sides, a charge of opposite sign will be induced in the conductive component and an adequate coupling force may be achieved. One of ordinary skill in the art would recognize many variations, modifications, and alternatives.

Figure 14:
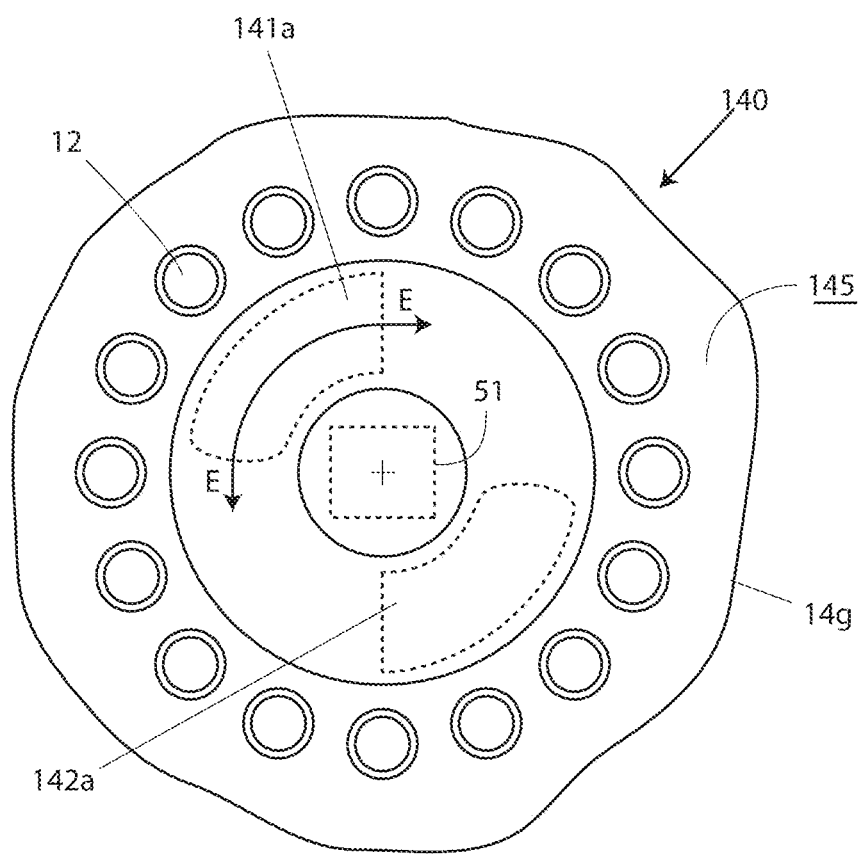
FIG. 14 is a plan view of an alternative smart interface element comprising tongue elements for mechanically interlocking with another contact array according to an embodiment of the present invention.
Figure 15:
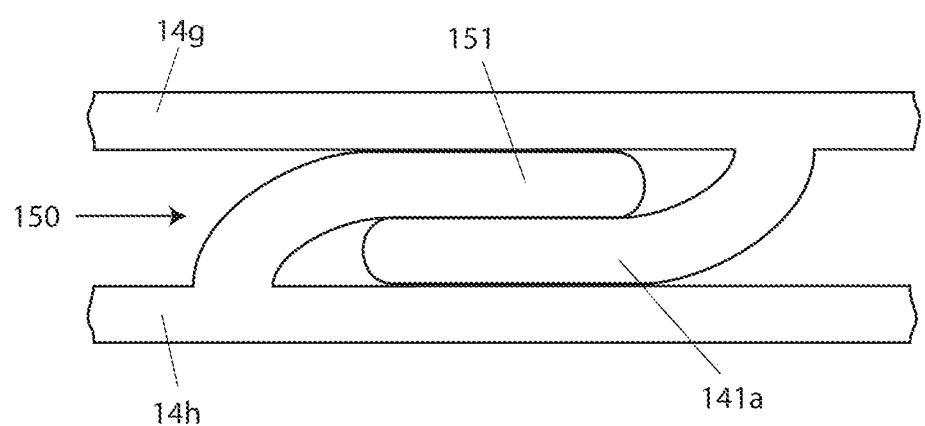
FIG. 15 is an expanded cross-sectional view of circular section EE of FIG. 14, showing mechanically interlocking features, at an interface with an opposing coupled module.

FIG. 14 illustrates a coupling face 145 depicting a circular format used in an alternative embodiment 140 of a smart interface element comprising substrate 14g, terminals 12, micro-controller chip 51, and inter-lockable features 141a and 142a, to be further described in reference to FIG. 15.

FIG. 15 is an enlarged cross-sectional view of circular section EE of FIG. 14 and depicts a mechanical coupling 150 between substrates 14g and 14h as an alternative embodiment of a coupling force element. 151 and 141a may be tongue-shaped elements as shown, capable of mating together when aligned at certain angular positions, and further capable of interlocking as shown to secure the parent modules together. Uncoupling of substrates 14g and 14h may be accomplished using a twisting action wherein a user applies torque to upper substrate 14g relative to lower substrate 14h, and on disengagement, lifts the upper device away from the lower device. Coupling of substrates 14g and 14h preferably comprises: approximately aligning the faces to be coupled, pressing them together, rotating one against the other to engage them, and interlocking them by applying torque. Other mechanical components may be used as cooperating or interlocking mechanical elements, and other user actions may be employed to couple or uncouple them.

Figure 16:
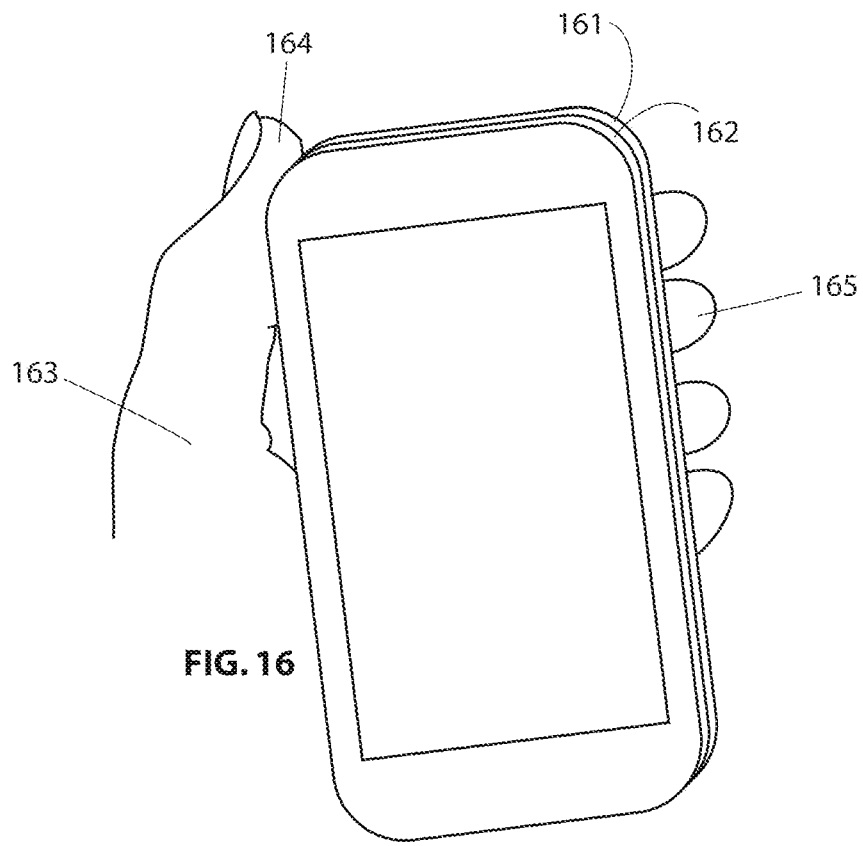
FIG. 16 is a perspective view of a pair of coupled modules in a user's hand according to an embodiment of the present invention.

FIG. 16 shows a pair of coupled modules 161 and 162 held comfortably in a user's hand 163, with rear device 161 gripped between thumb 164 and fingertips 165. The devices may be coupled using one of the coupling force elements described herein.

Figure 17:
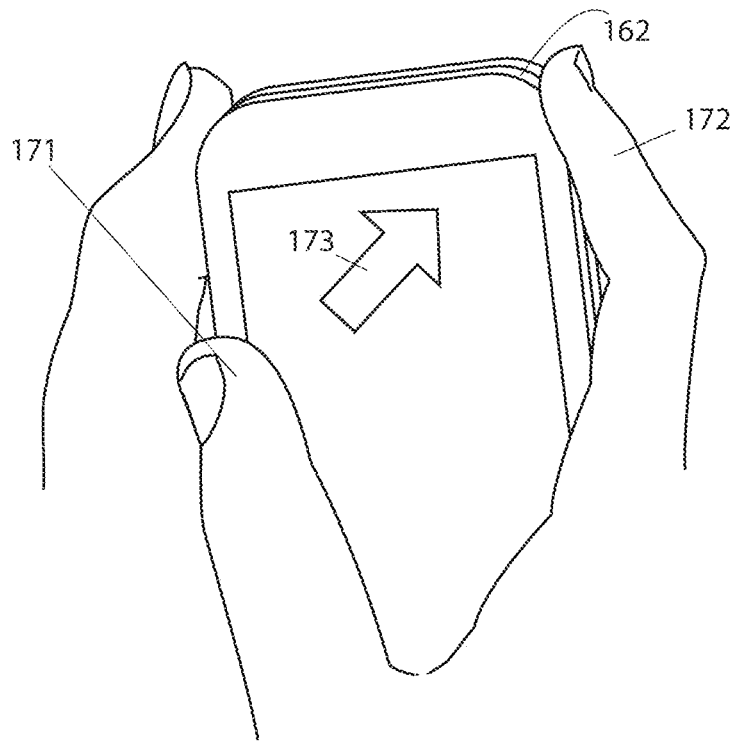
FIG. 17 is a perspective view showing how the coupled modules of FIG. 16 may be uncoupled by a user employing finger manipulations, illustrating the "thumb slide" method according to an embodiment of the present invention.

FIG. 17 shows a method for unsnapping or uncoupling the coupled module pair depicted in FIG. 16. The upper device 162 may be gripped between thumb 171 and forefinger 172 of a user's second hand, and the devices separated or uncoupled using a sliding motion 173 as indicated by the arrow in the figure. This uncoupling action may be referred to as a "thumb slide method", and may be most applicable to interfaces comprising magnets or electrical charge regions.

Figure 18:
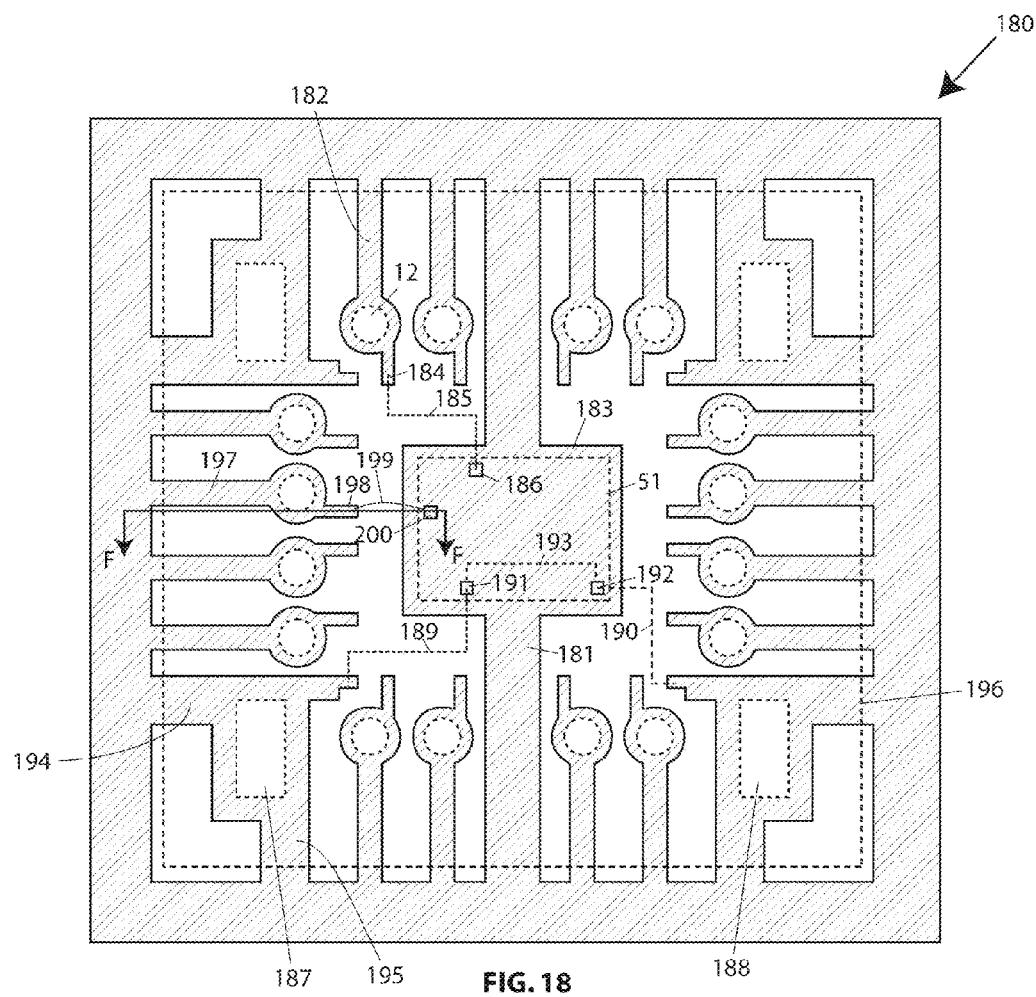
FIG. 18 is a plan view of a lead frame configured to hold a micro-controller chip in addition to magnets and terminals according to an embodiment of the present invention.

FIG. 18 illustrates a lead frame 180 for use with a smart interface element such as 10e of FIG. 5. Lead frame 180 comprises a paddle 181 and multiple leads 182 in some embodiments. Paddle 181 comprises a die attach region 183 to which micro-controller chip 51 may be bonded. Each individual lead 182 may capture a component of the smart interface element such as terminal 12 described in reference to FIG. 3. Lead 182 may further comprise lead extension 184 and an interconnection element 185 may connect from lead extension 184 to a corresponding input/output pad 186 of chip 51. Interconnection element 185 may be a bond wire or a printed conductive trace as examples. Printed conductive traces may be formed in an additive manner using a 3D printer for example. Component 187 may be a magnet for example, and the magnet may act as both a coupling force element and an electrical terminal, particularly for use as a high current terminal for Power or Ground as examples. Alternative embodiments may comprise more than one chip attached to die attach region 183, or support chips may be provided external to lead frame 180, coupled to micro-controller chip 51 through the leads such as 182. The specification of the associated smart interface element such as 10e may be expanded to include specification of such support chips.

For the case of magnets used as electrical terminals, component 187 may be commoned with component 188 using interconnection elements 189 and 190, input/output pads 191 and 192, and a shorting buss 193 on chip 51. Components 187 and 188 may each comprise electrical charges embedded in a plastic part and attached to lead frame 180 as a further example. To provide a more secure attachment for elements 187 and 188, more than one lead may be used, such as leads 194 and 195 in the figure. Trim line 196 is shown, where the outer frame is removed after the interface module has been completed, including attachment of the controller chip, compliant terminals, coupling force elements, bond wires and the like; and optionally molding of material around the various components. Removal of the outer frame may comprise a punching operation for example. Section FF is shown, for further description of lead 197, lead extension 198, bond wire 199, and input/output pad 200 in FIG. 19.

Figure 19:
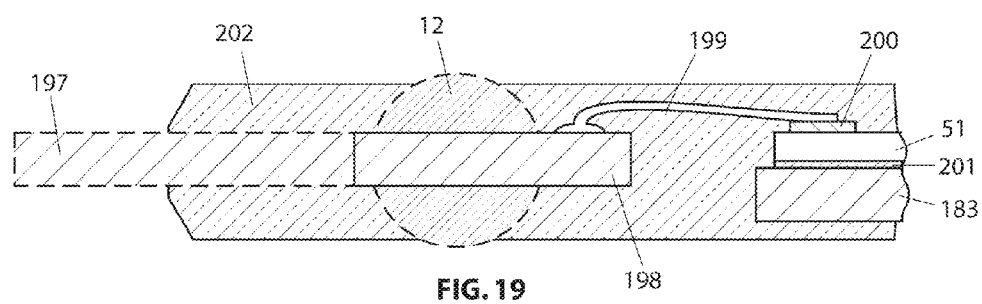
FIG. 19 is an expanded cross-sectional view of section FF of FIG. 18, showing details of a bond wire and a terminal.

FIG. 19 is an expanded cross-sectional view of section FF of FIG. 18. Lead 197, extended lead 198, bond wire 199, and input/output pad 200 are shown, together with a portion of micro-controller chip 51 with its die attach pad 183 and die attach material 201. The profile of a terminal 12 is shown for reference, and optional molded material 202 is also shown. The molded material may provide structural support and some moisture protection.

Figure 20:
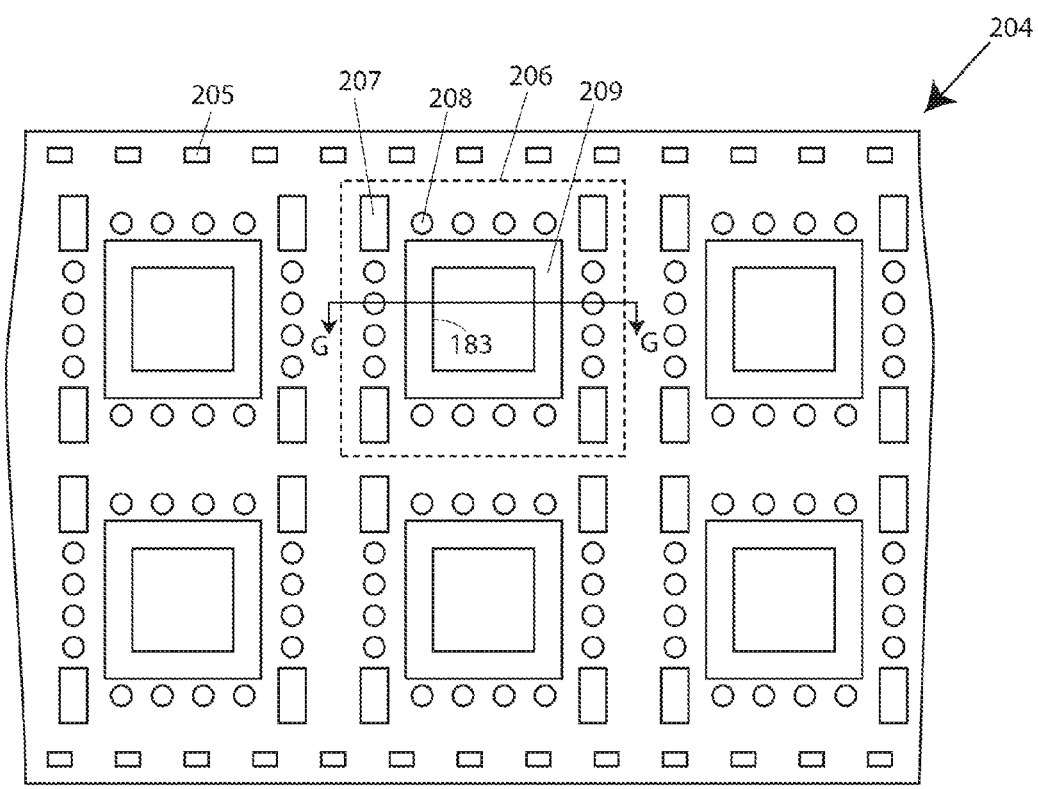
FIG. 20 is a plan view of a tape substrate configured to accept multiple units, each unit comprising a micro-controller chip in addition to magnets and terminals according to an embodiment of the present invention.

FIG. 20 depicts a tape substrate 204, typically formed from a thin sheet of polyimide such as KAPTON. Substrate 204 may comprise sprocket holes 205, useful for conveying the substrate through a roll-to-roll manufacturing process. Multiple contact array sites such as 206 are shown, each one comprising apertures 207 for attaching magnets and 208 for attaching terminals. Die attach pad 183 is shown, and also a region 209 bordering die attach pad 183 where bond wires may be formed. As will be evident to one of skill in the art, the tape substrate 204 provides a structure that enables one or both of the blade coupling force elements (e.g., magnets) as well as the blade terminals to be accessible from opposing sides of the blade. Thus, in some embodiments, thin blade modules that are accessible from both sides of the blade module are provided by some embodiments of the present invention.

Figure 21:
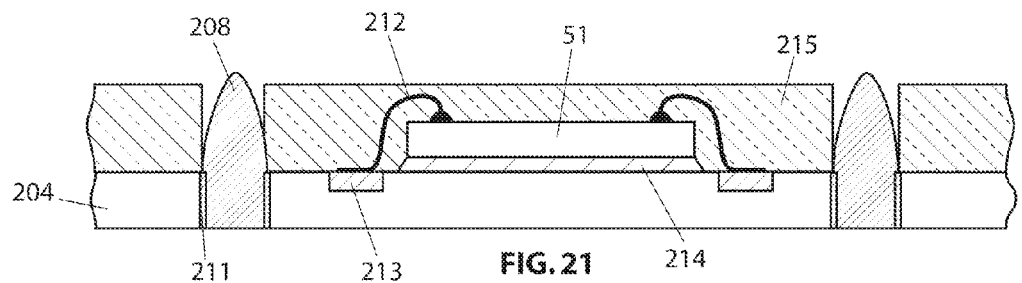
FIG. 21 is an expanded cross-sectional view of section GG of FIG. 20, following assembly of a smart interface element.

FIG. 21 is an expanded cross-sectional view of section GG of FIG. 20. Tape substrate 204 is shown with plated through holes 211 for mounting terminals 208 of FIG. 20. Bond wire 212 connects from an input/output pad (not shown) of micro-controller chip 51 to a substrate bonding pad 213. A die attach bonding material 214 is shown, and also a molded material 215.

Figure 22:
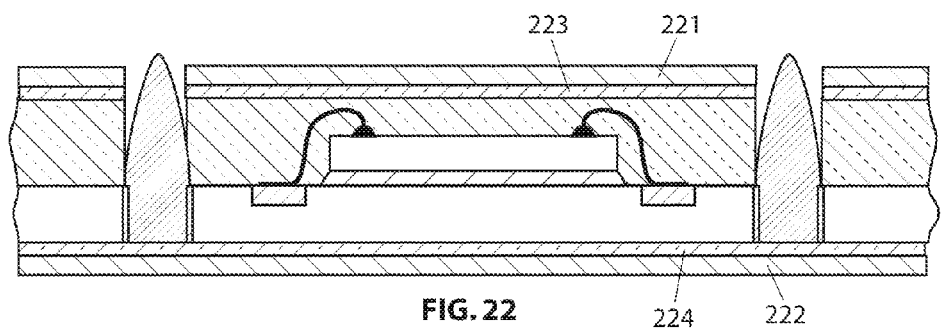
FIG. 22 is an expanded cross-sectional view of an alternate construction similar to that shown in FIG. 21 and illustrating metallic foils that are attached at exterior surfaces according to an embodiment of the present invention.

FIG. 22 illustrates the structure of FIG. 21 with the addition of metallic foils 221 and 222 attached using adhesive layers 223 and 224. Each metallic foil may provide an effective barrier to water, enabling the electronic packaging configuration to be semi-hermetic. One or more of the metallic foils may be replaced with a transparent glass sheet, particularly if the parent module comprises a display, and the glass sheet may comprise GORILLA GLASS or WILLOW GLASS as examples. Each of these glasses is available from CORNING INCORPORATED with an office in Corning, N.Y., USA.

Figure 23:
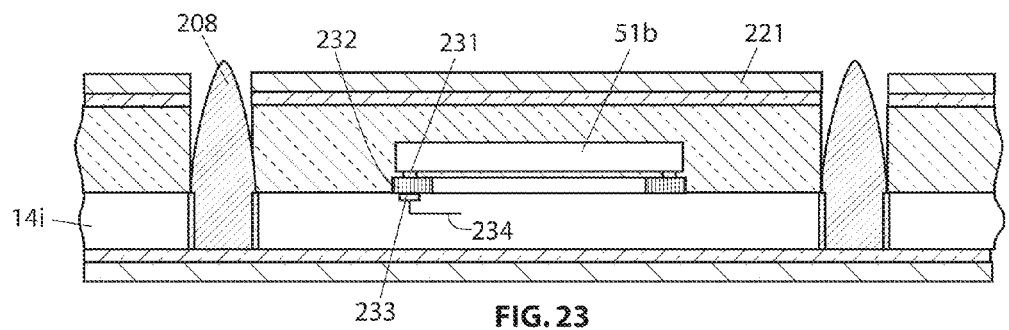
FIG. 23 is a cross-sectional view showing a flip chip assembly of the micro-controller chip, employing an anisotropic conductive film according to an embodiment of the present invention.

FIG. 23 illustrates an alternative flip chip method for mounting micro-controller chip 51b and inter-connecting input/output pads of the chip to conductive traces in substrate 14i. An input/output pad 231 of chip 51b is shown, connecting through a ring-shaped planar element 232 of anisotropic conductive film (ACF) to a corresponding pad 234 in substrate 14i. The ACF provides a vertical connection via microscopic conductive balls disposed in a matrix of non-conducting material. As is known in the art, when the material is compressed in the vertical direction during the assembly process, the conductive balls make contact with one another in the vertical direction but not in the horizontal direction.

Figure 24:
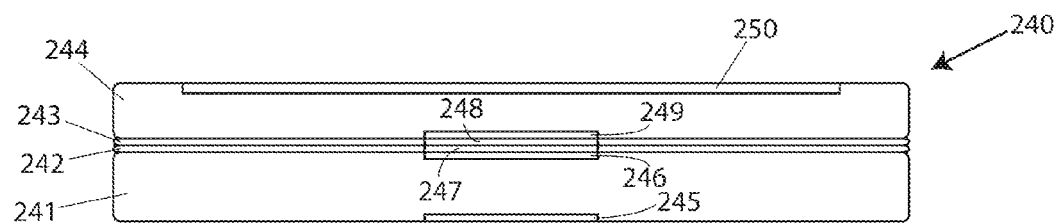
FIG. 24 is a schematic side view of a stacked system in a smart phone device format according to an embodiment of the present invention.

FIG. 24 shows a stacked electronic system 240 in a smart phone device format. The stack includes a bottom blade 241, two intermediate blades 242 and 243, and a top blade 244. Smart interface elements 245-249 are provided as shown, and they provide physical coupling between the blades. Interface module 245 is included so that blade 241 may be coupled with another blade or with another stack in another use case. Blades 242 and 243 may be as thin as 1 mm for example. The magnets and terminals of interface module 248 in blade 243 may extend through the blade, one set of them providing coupling at each of two coupling faces. A separate set of magnets and terminals are provided in interface modules 245 and 246 of blade 241. Top blade 244 may comprise a touch/display screen 250 as shown, and may include only one interface module, 249.

Figure 25:
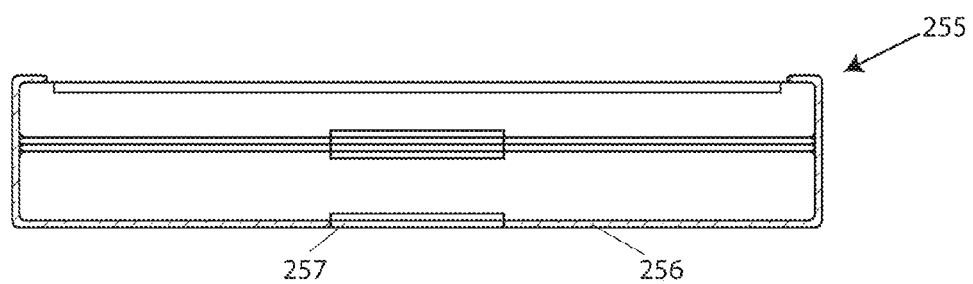
FIG. 25 is a cross-sectional view illustrating the stacked system shown in FIG. 24 with a protective cover and the protective cover comprises a contact array.

FIG. 25 shows stacked system 255 comprising the stacked system 240 of FIG. 24, and further comprising a protective cover 256. Cover 256 may be a hard or a soft cover, and may include interface module 257 for connecting with another blade or another stack of blades in a different use case. Since module 257 typically requires just a simple feed through of the signals, it may comprise a simple contact array rather than an intelligent interface element. Cover 256 may be provided with a user-selected image, to personalize his or her system 255. Cover 256 may protect system 255 during drops for example. Further it may include elastic elements that serve to hold the blades in a unified stack that is robust with respect to drops and potential mishandling.

Figure 26:
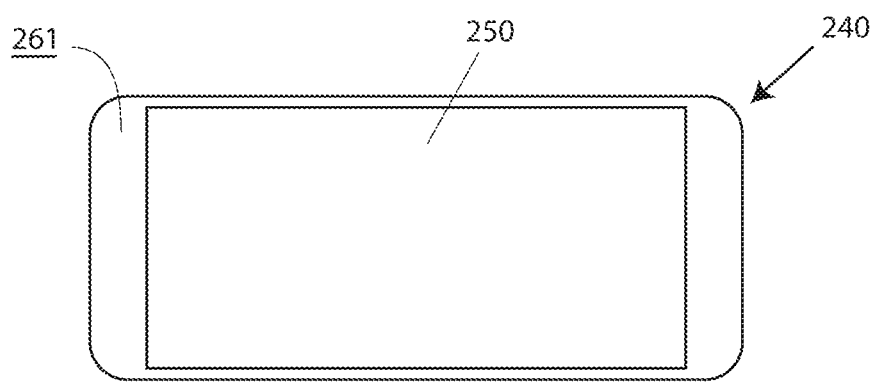
FIG. 26 is a plan view of the stacked system shown in FIG. 24.

FIG. 26 shows the plan view of stacked system 240 of FIG. 24, including top face 261 and touch/display screen 250.

Figure 27:
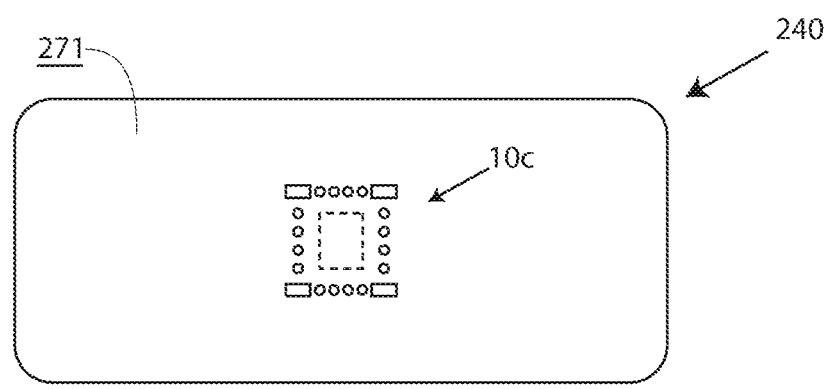
FIG. 27 is a bottom view of the stacked system shown in FIG. 24.

FIG. 27 shows the bottom view of stacked system 240 of FIG. 24, including coupling face 271 and contact array/interface module 10c, described in reference to FIG. 5.

Figure 28:
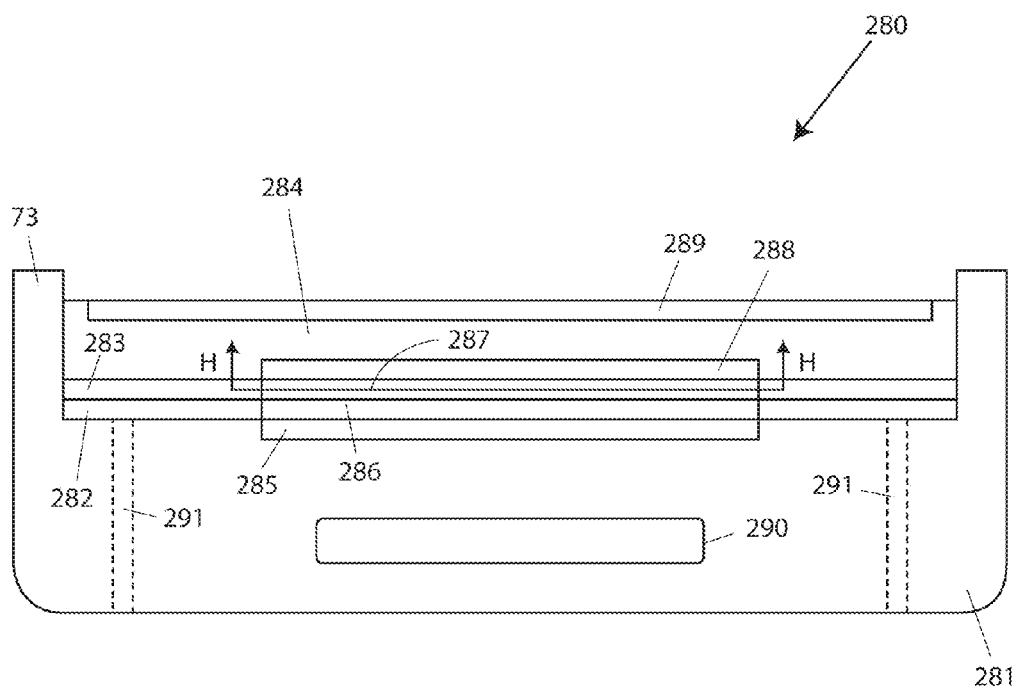
FIG. 28 shows a schematic cross-sectional view of a stacked system in a smart watch device format according to an embodiment of the present invention.

FIG. 28 illustrates a stacked electronic system 280 in a smart watch device format. A base module 281 is shown, two intermediate blade modules 282 and 283, and a top blade module 284. Interface modules 285-288 are provided to physically couple the elements of the stack, including base module 281 and blade modules 282-284. Intermediate blade modules 282 and 283 may be as thin as 1 mm for example. Top blade module 284 may include a touch display screen 289 and only one interface module, 288. A slot 290 may be provided for attaching a watch band for example, that may be attached to a user's wrist. Thus, in some embodiments, the stacked electronic system can include a plurality of blades, with one of the plurality of blades being disposed at a distal end of the at least one of the one or more blades with respect to the electronic device as illustrated for blade 284, which includes touch/display screen 289. Through holes 291 may be provided as shown, so that a user may eject blade modules using a simple tool like a bent paper clip. Through holes 291 may also be configured so that access is provided only to a jeweler, or to a technician having special tools.

Figure 29:
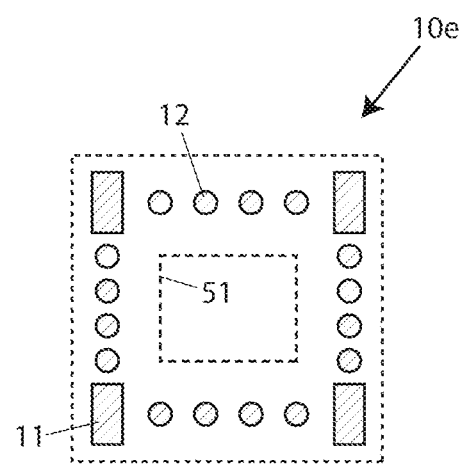
FIG. 29 illustrates a cross section of a smart interface element corresponding to section HH of FIG. 28.

FIG. 29 illustrates interface module 287 of blade module 283 corresponding to section HH of FIG. 28. Interface module 287 may comprise contact array/interface module 10e described in reference to FIG. 5 for example, including magnets 11, terminals 12, and a micro-controller chip 51.

Figure 30:
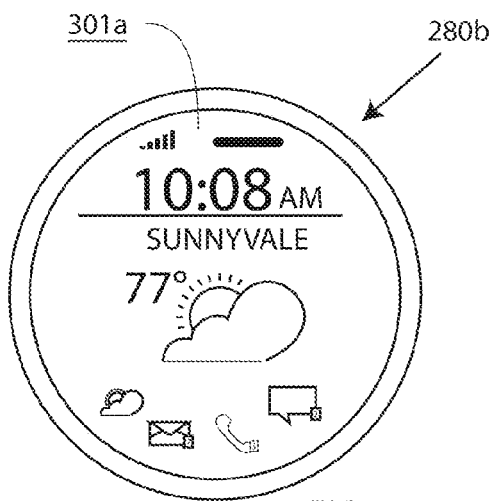
FIG. 30 shows a plan view of a display face of a smart watch device in dashboard mode, including dashboard widgets.

FIG. 30 depicts a watch face 301a of stacked electronic system 280 of FIG. 28 in the form of watch blade module 280b comprising a touch/display screen in dashboard mode, including widgets for accessing the location, time-of-day, signal strength, battery charge level, weather, location, email, voice messages, and text messages as examples.

Figure 31:
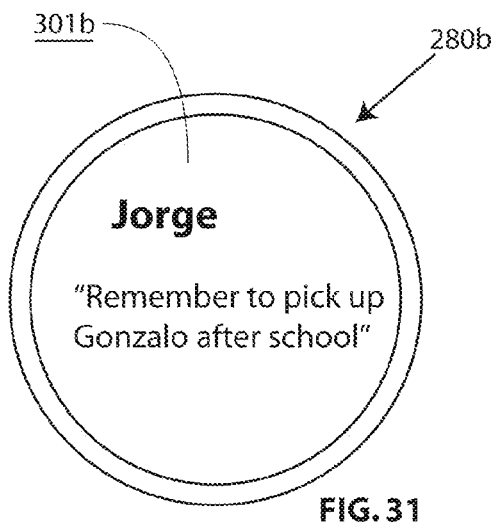
FIG. 31 depicts a plan view of a display face of a smart watch device in message mode.

FIG. 31 depicts watch face 301b of stacked electronic system 280 of FIG. 28 in the form of watch blade module 280b comprising a touch/display screen in text message mode as a further example.

Figure 32:
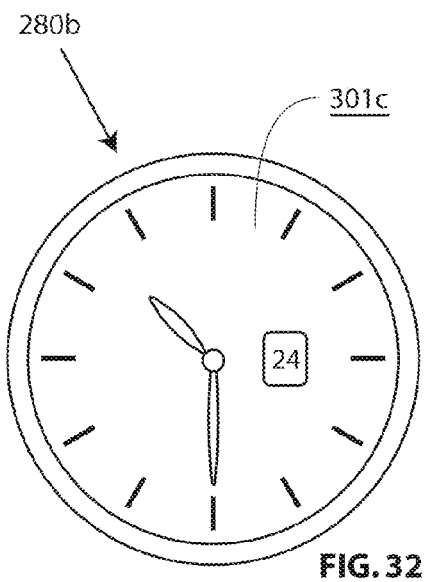
FIG. 32 shows a plan view of a display face of a smart watch device in timepiece mode.

FIG. 32 depicts watch face 301c of stacked electronic system 280 of FIG. 28 in the form of watch blade module 280b comprising a touch/display screen in time-of-day mode as a further example.

Figure 33:
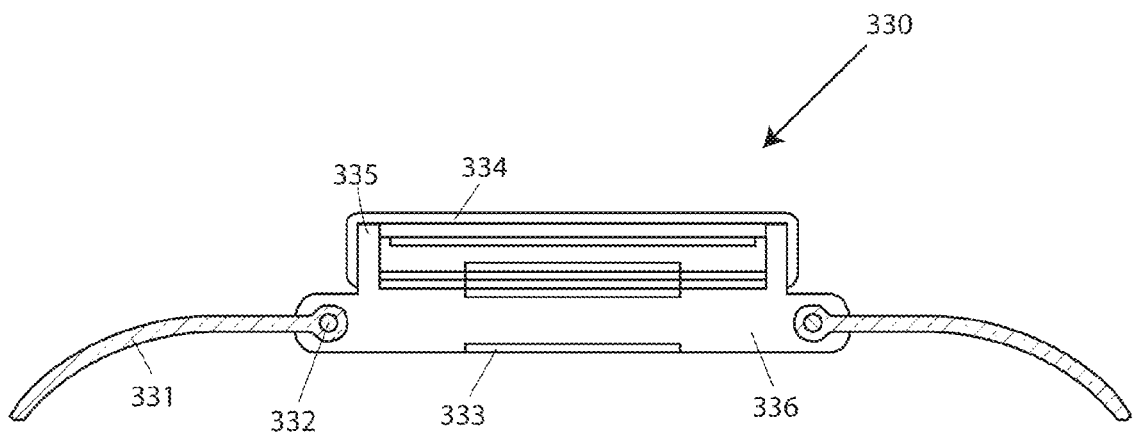
FIG. 33 is a schematic cross-sectional view of an alternative watch embodiment, including attachment to a wrist band according to an embodiment of the present invention.

FIG. 33 shows an alternative form 330 of a smart watch device module as a stacked electronic system having a complement of blades similar to that of system 280 of FIG. 28. Module 330 includes a watch band 331 that may attach using pins 332. Interface module 333 is provided so that the entire stacked device can be attached to another device for charging, syncing, or for any other suitable purpose. In addition, a protective transparent cap 334 is shown. Cap 334 may attach to walls 335 of base module 336 using elastic elements or a screw thread having the outside diameter of the watch face, thereby providing additional physical security to module 330, including additional containment of the installed blade modules.

Figure 34:
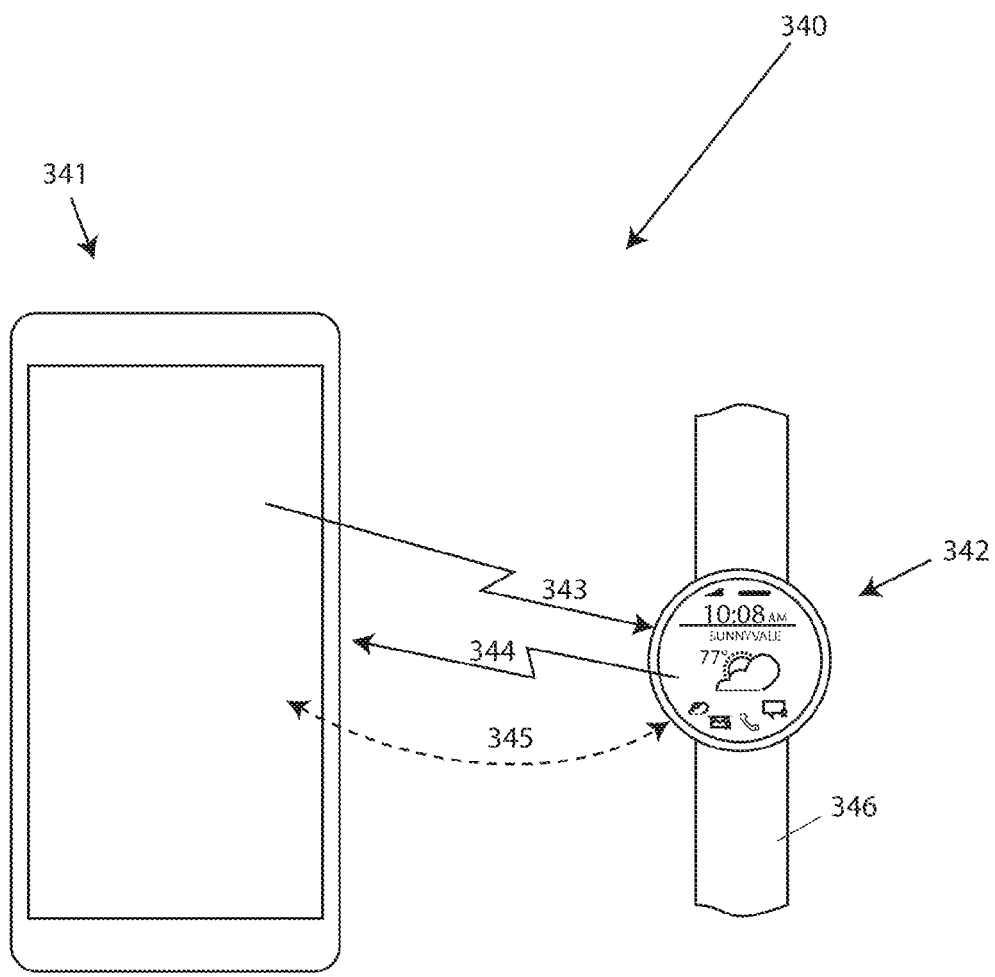
FIG. 34 illustrates wireless and physically connected communication interfaces between a pair of devices of different form factors according to an embodiment of the present invention.

FIG. 34 depicts a communication scenario 340 comprising communication between a device 341 in smart phone device format and device 342 in smart watch device format as an example. Device 341 may send radio frequency (RF) signals 343 to device 342. Signals 343 may relate to over-the-air provisioning for example, and may conform to a standard such as WIFI or BLUETOOTH. Similarly, smart watch device 342 may send RF signals 344 (wireless signals) to device 341. Additionally, a directly connected bi-directional interface 345 may be used to communicate between device 341 and device 342. The direct physical connections may be provided by contact arrays and interface modules as described herein. An interface module such as 10f described in reference to FIG. 6 may be provided in the back face of device 341, in the removable blade modules of device 342, and in the back face of watch module 342. Thus blade modules and system or subsystem stacks and complete devices comprising system stacks may be coupled and uncoupled as required, for charging or syncing or establishing trusted pair relationships, or for any other suitable purpose.

Figure 35:
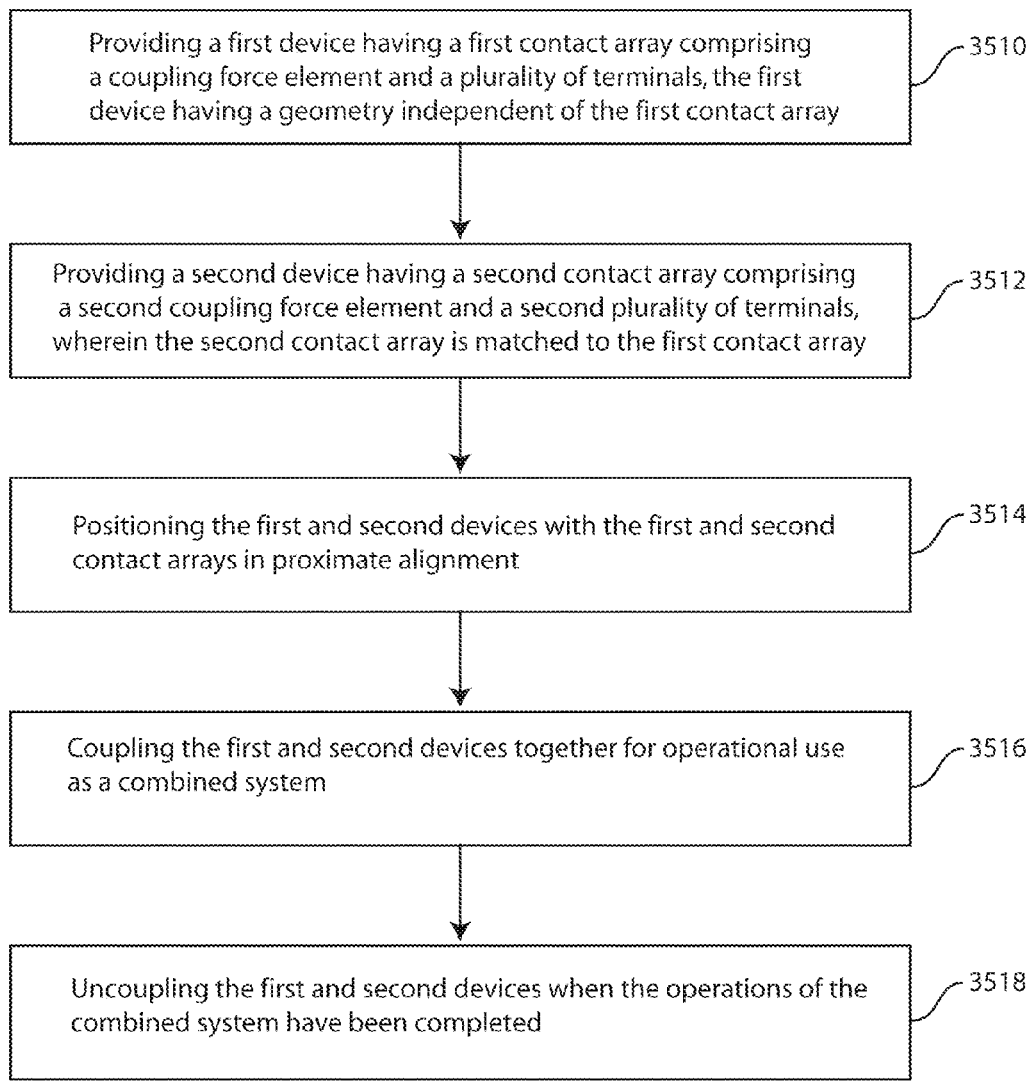
FIG. 35 is a simplified flowchart illustrating a method of connecting electronic devices according to an embodiment of the present invention.

FIG. 35 is a simplified flowchart illustrating a method of connecting electronic devices according to an embodiment of the present invention. The method includes providing a first device having a first contact array comprising a coupling force element and a plurality of terminals (3510). The first device has a geometry independent of the first contact array. As illustrated in FIG. 1B, the device geometry, illustrated by wavy outline 16z is independent of the contact array geometry. The coupling force element can include at least one of a magnet or an electric charge region. The method also includes providing a second device having a second contact array comprising a second coupling force element and a second plurality of terminals (3512). The second contact array is matched to the first contact array. As illustrated throughout the present specification, the contact array geometry provides a standardized interface that can be used to couple a wide variety of devices of varying type.

The method further includes positioning the first and second devices with the first and second contact arrays in proximate alignment (3514) and coupling the first and second devices together for operational use as a combined system (3516). After coupling, the first and second devices can interact and interoperate, providing a combination of functions provided by the individual devices.

The method additionally includes uncoupling the first and second devices when the operations of the combined system have been completed (3518). As an example, the first device and the second device can be characterized by a breakaway force in the range of 0.2-4.0 pounds when coupled. In an embodiment, coupling the first and second devices together comprises using a snap-on action and uncoupling the first and second devices comprises using a snap-off action. In another embodiment, uncoupling the first and second devices comprises holding the first device between thumb and fingers of a first hand, gripping the second device between thumb and fingers of the second hand, and manipulating the second device with respect to the first device until the devices are uncoupled.

In a particular embodiment, the method includes generating a first tone sequence associated with the coupling of the first and second devices and generating a second tone sequence different from the first tone sequence, the second tone sequence being associated with uncoupling of the first and second devices.

It should be appreciated that the specific steps illustrated in FIG. 35 provide a particular method of connecting electronic devices according to an embodiment of the present invention. Other sequences of steps may also be performed according to alternative embodiments. For example, alternative embodiments of the present invention may perform the steps outlined above in a different order. Moreover, the individual steps illustrated in FIG. 35 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 36:
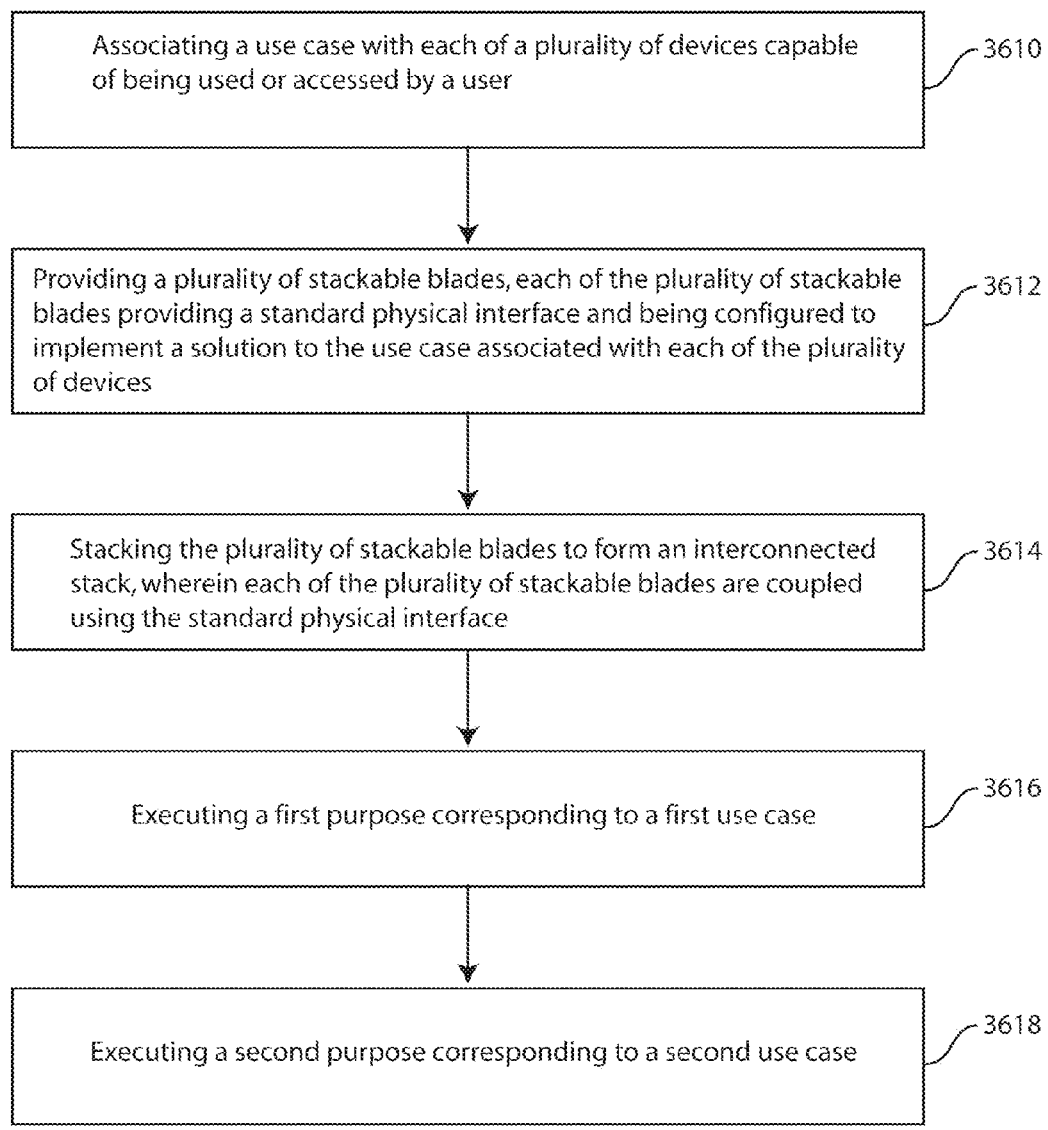
FIG. 36 is a simplified flowchart illustrating a method of implementing use cases according to an embodiment of the present invention.

FIG. 36 is a simplified flowchart illustrating a method of implementing use cases according to an embodiment of the present invention. The method includes associating a use case with each of a plurality of devices capable of being used or accessed by a user (3610) and providing a plurality of stackable blades (3612). Each of the plurality of stackable blades provides a standard physical interface and is configured to implement a solution to the use case associated with each of the plurality of devices.

The method further includes stacking the plurality of stackable blades to form an interconnected stack (3614). Each of the plurality of stackable blades are coupled using the standard physical interface. In an embodiment, the standard physical interface comprises one or more magnets disposed on a coupling face and a plurality of terminals disposed on the coupling face. The periphery of the one or more magnets and the plurality of terminals define a coupling area and the peripheral area of one or more of the plurality of stackable blades is greater than and independent of the coupling area. In a particular embodiment, the standard physical interface is characterized by a bisector, the one or more magnets comprise at least a pair of magnets, each magnet of the at least one pair of magnets being positioned an equal distance from the bisector, and the plurality of terminals are arrayed in pairs. Each terminal of each pair is positioned an equal distance from the bisector.

The method also includes executing a first purpose corresponding to a first use case (3616) and executing a second purpose corresponding to a second use case (3618). In a particular embodiment, the method additionally includes removing at least one blade from the interconnected stack, inserting a user-selected blade to form a second interconnected stack, and executing a third purpose corresponding to a third use case. As described herein, the design of the stackable blades is such that a use can typically remove the at least one blade and form the second interconnected stack without tools.

It should be appreciated that the specific steps illustrated in FIG. 36 provide a particular method of implementing use cases according to an embodiment of the present invention. Other sequences of steps may also be performed according to alternative embodiments. For example, alternative embodiments of the present invention may perform the steps outlined above in a different order. Moreover, the individual steps illustrated in FIG. 36 may include multiple sub-steps that may be performed in various sequences as appropriate to the individual step. Furthermore, additional steps may be added or removed depending on the particular applications. One of ordinary skill in the art would recognize many variations, modifications, and alternatives.

The following of Glossary of terms and definitions may be used to more fully understand embodiments of the present invention. These terms are not intended to limit the scope of the present invention.

Ancillary device: A device having a support function in relation to a host device
Blade module: A stackable element having a coupling face and a standard contact array embedded in the coupling face; "blade module" may be shortened to "blade"
Breakaway force: The force required to separate two coupled components by sliding the second with respect to the first
Companion device: A digital assistant to a human user
Complementary electric symmetry: Reflective symmetry except that electric poles are reversed on opposite sides of the reflection plane
Complementary magnetic symmetry: Reflective symmetry except that magnetic poles are reversed on opposite sides of the reflection plane
Contact array: An array of terminals and including at least one coupling force element
Coupling face: A face of a device, contained within a body, that may be coupled to a corresponding face of another device
Coupling force element: An element providing coupling force at a coupling face, the element comprising at least one of a magnet, an electric charge region, or an inter-lockable mechanical feature
Electronic ecosystem: A collection of electronic devices that are configured to inter-operate with one another
Host device: A device to which a second device may be coupled
Hot swappable: Capable of being swapped without damage while not interrupting the application of power prior to uncoupling
Lead frame: A metal component for assembling a semiconductor chip, comprising multiple leads and a paddle for mounting the chip
Magnetic field containment device: A device configuration for reducing the field extending from a pair of magnet poles, comprising a material of high magnetic permeability extending between and optionally around the poles
Mother device: A device to which a second device may be coupled for receiving resources
Pinout: A cross-reference between the contacts of an electronic component and its functions
Protocol conversion: A conversion by an electronic device of input signals conforming to a first protocol, to output signals conforming to a second protocol
Smart interface element: An interface element including both a contact array and a micro-controller
Snap off action: An action wherein coupled parts are separated by breaking the coupling force interaction
Snap on action: An action wherein opposing parts snap together due to a coupling force
Tape substrate: A substrate for assembling a semiconductor chip, the substrate comprising a material like a polyimide film
Touch/display screen: A screen comprising visual display elements and elements sensitive to touches or gestures
Ubiquitous connectivity: An attribute of an electronic ecosystem wherein connections can be easily made between heterogeneous devices, by making use of a standard contact array.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of implementing use cases, the method comprising:
   associating a use case with each of a plurality of devices capable of being used or accessed by a user;
   providing a plurality of stackable blades, each of the plurality of stackable blades providing a standard physical interface and being configured to implement a solution to the use case associated with each of the plurality of devices, wherein the standard physical interface comprises:
   one or more magnets disposed on a coupling face; and
   a plurality of terminals disposed on the coupling face,
   wherein a periphery of the one or more magnets and the plurality of terminals define a coupling area and wherein a peripheral area of one or more of the plurality of stackable blades is greater than and independent of the coupling area;
   stacking the plurality of stackable blades to form an interconnected stack, wherein each of the plurality of stackable blades are coupled using the standard physical interface;
   executing a first purpose corresponding to a first use case; and
   executing a second purpose corresponding to a second use case.

2. The method of claim 1, wherein:
   the standard physical interface is characterized by a bisector;
   the one or more magnets comprise at least a pair of magnets, each magnet of the at least one pair of magnets being positioned an equal distance from the bisector; and
   the plurality of terminals are arrayed in pairs, each terminal of each pair being positioned an equal distance from the bisector.

3. A method of implementing use cases, the method comprising:
   associating a use case with each of a plurality of devices capable of being used or accessed by a user;
   providing a plurality of stackable blades, each of the plurality of stackable blades providing a standard physical interface and being configured to implement a solution to the use case associated with each of the plurality of devices;
   stacking the plurality of stackable blades to form an interconnected stack, wherein each of the plurality of stackable blades are coupled using the standard physical interface;
   executing a first purpose corresponding to a first use case;

executing a second purpose corresponding to a second use case;

removing at least one blade from the interconnected stack;

inserting a user-selected blade to form a second interconnected stack; and executing a third purpose corresponding to a third use case.

4. The method of claim 3 wherein removing the at least one blade and forming the second interconnected stack is performed by a user without tools.

* * * * *